United States Patent [19]
Fazan et al.

[11] Patent Number: 5,392,189
[45] Date of Patent: Feb. 21, 1995

[54] CAPACITOR COMPATIBLE WITH HIGH DIELECTRIC CONSTANT MATERIALS HAVING TWO INDEPENDENT INSULATIVE LAYERS AND THE METHOD FOR FORMING SAME

[75] Inventors: Pierre C. Fazan; Gurtej S. Sandhu, both of Boise, Id.

[73] Assignee: Micron Semiconductor, Inc., Boise, Id.

[21] Appl. No.: 104,524

[22] Filed: Aug. 10, 1993

Related U.S. Application Data

[63] Continuation-in-part of Ser. No. 44,331, Apr. 2, 1993.

[51] Int. Cl.$^6$ ............................................. H01G 1/01
[52] U.S. Cl. .................................... 361/305; 361/303; 361/311; 361/313; 361/321.1; 257/306; 257/310
[58] Field of Search ............... 361/303, 305, 311, 312, 361/313, 321.1, 322; 427/79, 81; 437/52, 60; 365/145, 149; 257/303, 304, 305, 306, 310, 532, 295

[56] References Cited

U.S. PATENT DOCUMENTS

| | | | |
|---|---|---|---|
| 5,005,102 | 4/1991 | Larson | 361/313 |
| 5,046,043 | 9/1991 | Miller et al. | 365/145 |
| 5,111,355 | 5/1992 | Anand et al. | 361/313 |
| 5,185,689 | 2/1993 | Maniar | 361/313 |
| 5,198,384 | 3/1993 | Dennison | 437/52 |
| 5,248,628 | 9/1993 | Okabe et al. | 437/60 |
| 5,340,765 | 8/1994 | Dennison et al. | 437/52 |

Primary Examiner—Bruce A. Reynolds
Assistant Examiner—Gregory L. Mills
Attorney, Agent, or Firm—Susan B. Collier

[57] ABSTRACT

The invention is a storage cell capacitor and a method for forming the storage cell capacitor having a storage node electrode comprising a barrier layer interposed between a conductive plug and an oxidation resistant layer. A thick insulative layer protects the sidewalls of the barrier layer during the deposition and anneal of a dielectric layer having a high dielectric constant. The method comprises forming the conductive plug in a thick layer of insulative material such as oxide or oxide/nitride. The conductive plug is recessed from a planarized top surface of the thick insulative layer. The barrier layer is then formed in the recess. The process is continued with a formation of a second insulative layer, a potion of which is removed to form an opening exposing a portion of the barrier layer. An oxidation resistant conductive layer is deposited in the recess and forms at least a portion the storage node electrode of the capacitor. Next a dielectric layer having a high dielectric constant is formed to overly the storage node electrode and a cell plate electrode is fabricated to overly the dielectric layer.

20 Claims, 23 Drawing Sheets

CAPACITOR COMPATIBLE WITH HIGH DIELECTRIC CONSTANT MATERIALS HAVING TWO INDEPENDENT INSULATIVE LAYERS AND THE METHOD FOR FORMING SAME

RELATED APPLICATIONS

The application is a continuation-in-part of co-pending application entitled "A METHOD FOR FORMING A STORAGE CELL CAPACITOR COMPATIBLE WITH HIGH DIELECTRIC CONSTANT MATERIALS", with Ser. No. 08/044,331, filed on Apr. 2, 1993, and is a sister application to the application filed simultaneously herewith entitled "A CAPACITOR COMPATIBLE WITH HIGH DIELECTRIC CONSTANT MATERIALS HAVING A LOW CONTACT RESISTANCE LAYER AND THE METHOD FOR FORMING SAME" and having Ser. No. 08/104,525.

FIELD OF THE INVENTION

This invention pertains to semiconductor technology, and more particularly to storage cell capacitors for use in dynamic random access memories.

BACKGROUND OF THE INVENTION

As memory devices become more dense it is necessary to decrease the size of circuit components. One way to retain the storage capacity of a dynamic random access memory (DRAM) device and decrease its size is to increase the dielectric constant of the dielectric layer of the storage cell capacitor. In order to achieve the charge storage efficiency needed in 256 megabit(Mb) memories and above, materials having a high dielectric constant, typically greater than 50, can be used as the dielectric layer between the storage node and the cell plate capacitor electrodes. The dielectric constant is a value characteristic of a material and is proportional to the amount of charge that can be stored in the material when it is interposed between two electrodes. $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$ are among some of the high dielectric constant materials that can be used in this application. These materials have dielectric constant values above 50 and will likely replace the standard $Si_3N_4$, $SiO_2/Si_3N_4$, $Si_3N_4/SiO_2$, or $SiO_2/Si_3N_4/SiO_2$ composite films used in 256 kilobits (Kb) to 64 megabits (Mb) generations of DRAMs. $Si_3N_4$ and $SiO_2/Si_3N_4$ composite films have dielectric constant values of 7 or less. The storage node and cell plate electrodes are also referred to as first and second electrodes.

Unfortunately high dielectric constant materials are incompatible with existing processes and can not be simply deposited on a polysilicon electrode as was the case for the lower dielectric constant materials, such as $Si_3N_4$ and $SiO_2/Si_3N_4$ composite layers. This incompatibility is a result of the $O_2$ rich ambient present during the high dielectric constant material deposition or during annealing steps. The $O_2$ oxidizes portions of the materials formerly used for the storage node plate. Also the capacitors employing the former materials undergo physical degradation during thermal cycles due to the diffusion of the storage node plate material into the dielectric.

In the storage cell capacitor incorporating BST, described in the IDEM-91 article entitled, A STACKED CAPACITOR WITH $(Ba_xSr_{1-x})TiO_3$ FOR 256M DRAM by Koyama et al., some of these aforementioned problems are resolved. The storage node electrode typically comprises a layer of platinum overlying a tantalum barrier layer which, in turn, overlies a polysilicon plug. Platinum is used as the upper portion of the first electrode since it will not oxidize during a BST deposition or subsequent anneal. An electrode that oxidizes would have a low dielectric constant film below the BST, thereby negating the advantages provided by the high dielectric constant material. The tantalum layer is introduced to avoid Si and Pt inter-diffusion and to prevent the formation of $SiO_2$ on top of the platinum surface. In addition, the platinum protects the top surface of the tantalum from strong oxidizing conditions during the BST deposition. FIG. 1 depicts the stacked storage node electrode of the related art comprising tantalum 1, platinum 2 overlying the polysilicon plug 3.

The sidewalls 4 of the tantalum film 1 formed during this process are subject to oxidation during the subsequent deposition of the BST layer. Since the tantalum 1 oxidizes the polysilicon plug 3 is also susceptible to oxidation. When portions of the polysilicon plug 3 and tantalum 1 are consumed by oxidation the capacitance of the storage cell capacitor is decreased since the storage node electrode is partially covered by a low dielectric constant film. Therefore the memory device cannot be made as dense.

In addition, the storage node contact resistance increases drastically between the polysilicon plug and the tantalum barrier layer as a result of degradation of the tantalum barrier layer during deposition of BST and other high dielectric constant materials.

OBJECTS OF THE INVENTION

An object of the invention is to increase density of a memory device by increasing capacitance of storage cell capacitors.

A further object of the invention is decreased contact resistance between the polysilicon electrode and the barrier layer and reduced degradation of the barrier layer.

SUMMARY OF THE INVENTION

The storage cell capacitor of the invention features a storage node electrode having a barrier layer which prohibits the diffusion of atoms. The barrier layer may be titanium nitride or another material which prohibits silicon diffusion. The barrier layer is interposed between a conductive plug and a non-oxidizing conductive material, typically platinum. A dielectric layer, typically $Ba_xSr_{(1-x)}TiO_3$ [BST], is deposited on the non-oxidizing material. The barrier layer is surrounded on its sides and exposed upper portions by one or more insulative layers.

The insulative layers and the non-oxidizing material protect the barrier layer from oxidizing during the deposition and anneal of the BST thereby also eliminating oxidation of the conductive plug. By eliminating oxidation of the barrier layer and oxidation of the conductive plug, capacitance is maximized, and the contact resistance is not affected.

Optionally, the invention also features a low contact resistance material lying between the conductive plug and the barrier layer.

The invention is a storage node capacitor and a method for forming the storage node capacitor having a storage node electrode comprising a barrier layer interposed between a conductive plug and an oxidation resistant conductive layer. The method comprises forming the conductive plug in a thick first layer of insulative material such as oxide or oxide/nitride. The conductive plug is recessed from a planarized top surface of the first insulative layer. The optional low contact resistance material if formed at the base of the recess. The barrier layer is then formed in the recess.

Next a second layer of insulative material is formed overlying the first layer of insulative material and optionally overlying a portion of the barrier layer. The process is continued with a formation of an oxidation resistant conductive layer overlying the barrier layer not covered by the second insulative layer.

Next a dielectric layer, typically having a high dielectric constant, is formed to overly the oxidation resistant conductive layer and a further conductive layer is fabricated to overly the dielectric layer.

Since the barrier layer is protected during the formation of the dielectric layer by both the oxidation resistant conductive layer and the thick insulative layer there is no oxidation of the barrier layer or the contact plug, thereby maximizing capacitance of the storage node and reducing high contact resistance issues.

BRIEF DESCRIPTION OF THE DRAWINGS

FIGS. 2–19 are cross-sectional views of a portion of a partially processed semiconductor wafer depicting the steps of the invention fabricating a storage cell capacitor.

FIG. 2 depicts field-effect transistors overlying a silicon substrate and wordlines overlying field oxide.

FIG. 3 is the wafer portion of FIG. 2 following the deposit of an undoped thick first insulative layer and planarization thereof.

FIG. 4 is the wafer portion of FIG. 3 following the masking and subsequent etching of the first insulative layer to form self-aligned openings.

FIG. 5 is the wafer portion of FIG. 4 following the formation of polysilicon plugs in the openings and the removal of the mask shown in FIG. 4.

FIG. 6 is the wafer portion of FIG. 5 following the recessing of the polysilicon plug in the thick oxide layer.

FIG. 7 is the wafer portion of FIG. 6 following an optional deposition of titanium.

FIG. 8 is the wafer portion of FIG. 7 following an anneal and/removal of unreacted titanium.

FIG. 9 is the wafer portion of FIG. 8 following the deposition of a titanium nitride layer.

FIG. 10 is the wafer portion of FIG. 9 following the planarization of the titanium nitride layer.

FIG. 11 is the wafer portion of FIG. 10 following the deposition of a thick second insulative layer and following the patterning and etch of the second insulative layer to create openings exposing portions of the planarized titanium nitride layer.

FIG. 16 is the wafer portion of FIG. 10 following the deposition of a thin second insulative layer and following the patterning and etch of the second insulative layer to create openings exposing portions of the planarized titanium nitride layer.

FIG. 17 is the wafer portion of FIG. 16 following the deposition of a platinum layer.

FIG. 18 is the wafer portion of FIG. 17 following the planarization of the platinum layer to expose the second insulative layer.

FIG. 19 is the wafer portion of FIG. 18 following the deposition of a high dielectric constant material and the deposition of a cell plate layer and following the patterning of these layers to complete the formation of the storage cell capacitor.

DETAILED DESCRIPTION OF THE PREFERRED EMBODIMENT

The method for fabricating the storage cell capacitor of the invention is shown pictorially in FIGS. 2–11.

Figure 1:
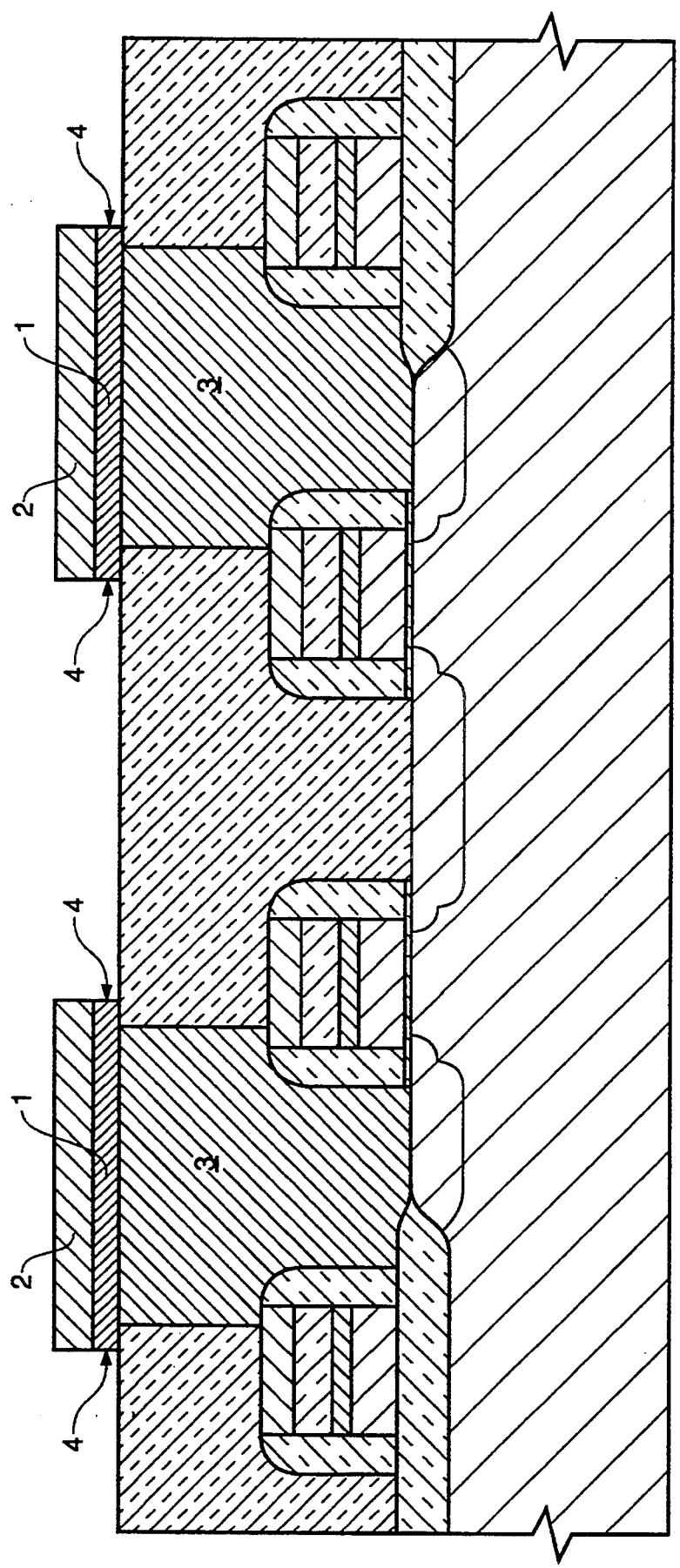
FIG. 1 is a cross-sectional view of a portion of a partially procured semiconductor wafer of the related art.
Figure 2:
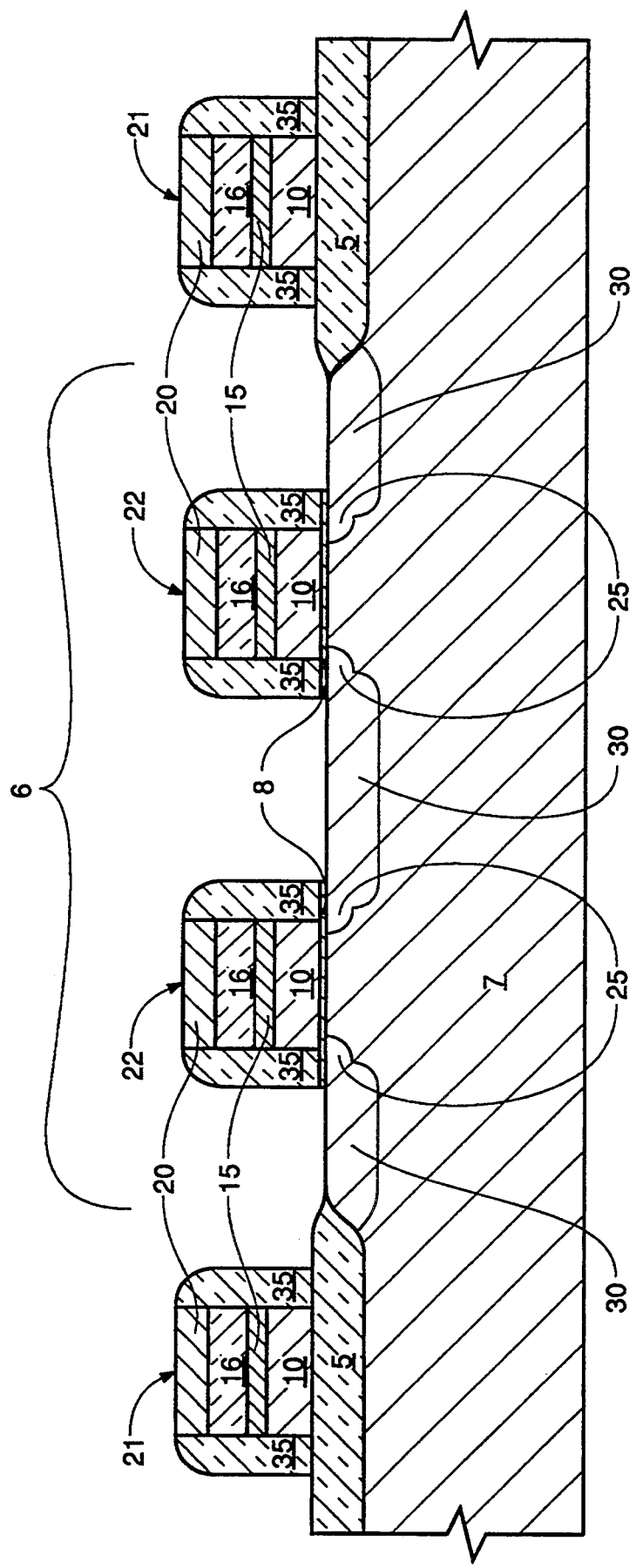

Referring to FIG. 2, a cross-sectional view of an in-process dynamic random access memory (DRAM) cell is shown following conventional local oxidation of silicon (LOCOS) or special LOCOS processing which creates substantially planar field oxide regions 5 (created using modified LOCOS or trench isolation processes) and future active areas 6 (those regions of the substrate not covered by field oxide) on a silicon substrate 7. The creation of the field oxide is preceded or followed by a thermally grown dielectric layer 8 of silicon oxide. The depicted cell is one of many cells that are fabricated simultaneously and comprise a memory array. Following the creation of the field oxide region 5 and dielectric layer 8 a first conductively doped polysilicon layer 10, a metal silicide layer (Wsi$_x$) 15, an oxide layer 16, and a thick nitride layer 20 are deposited. The thick nitride layer 20 will function as an etch stop during the storage node buried contact etch, thus allowing self-alignment if desired. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 8. The lightly-doped regions 25 are created utilizing a phosphorus or arsenic implant. Deposition, densification and a reactive ion etch (RIE) of a silicon nitride spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

The formation of the FETs 22 and wordlines 21 as described are exemplary of one application to be used in conjunction with the present embodiment of the invention. Other methods of fabrication and other applications are also feasible and perhaps equally viable.

Figure 3:
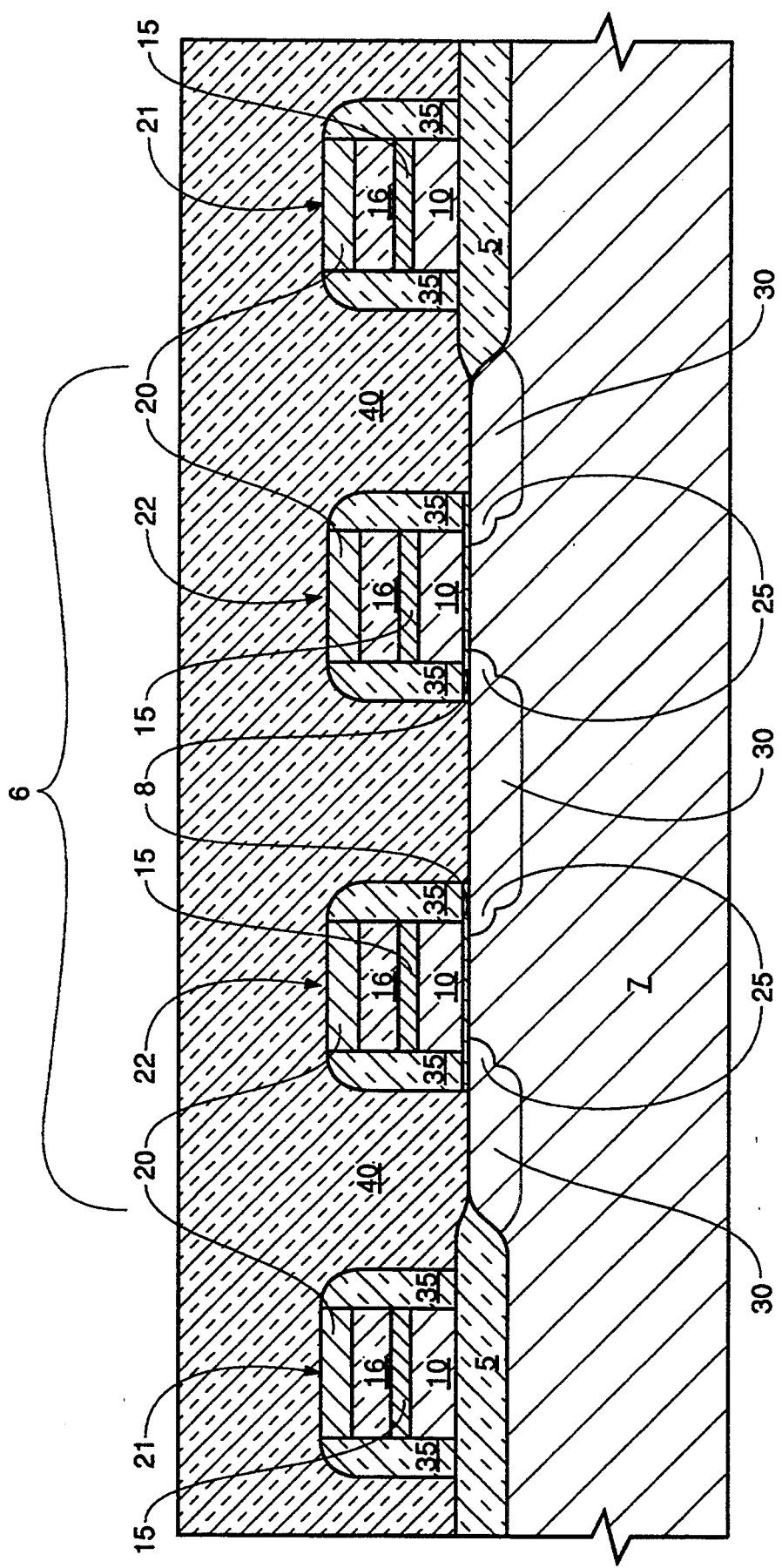

In FIG. 3 a thick first insulative conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide 40 is planarized, preferably chemical mechanically planarized (CMP), in order to provide a uniform height. Optionally nitride, oxynitride or another suitable material may be deposited as the insulative layer.

In general, CMP involves holding or rotating a wafer of semiconductor material against a wetted polishing surface under controlled chemical slurry, pressure, and temperature conditions. A chemical slurry containing a polishing agent such as alumina or silica may be utilized as the abrasive medium. Additionally, the chemical slurry may contain chemical etchants. This procedure may be used to produce a surface with a desired endpoint or thickness, which also has a polished and planarized surface. Such apparatus for polishing are disclosed in U.S. Pat. Nos. 4,193,226 and 4,811,522 which are herein incorporated by reference. Another such apparatus is manufactured by Westech Engineering and is designated as a Model 372 Polisher.

At this juncture buried digit lines may be fabricated as described in U.S. Pat. No. 5,168,073 herein incorporated by reference. In the case where the buried digit lines are formed by the method described in U.S. Pat. No. 5,168,073 an initial thick oxide layer is deposited and planarized and then overlaid with a relatively thick $Si_3N_4$ layer which is also planarized. These two layers serve the same function as the oxide layer 40 and may be used in place of oxide layer 40 even in the case where buried digit lines are not formed. When buried digit lines are formed the thick oxide is typically deposited prior to the digit line formation and the $Si_3N_4$ is deposited subsequent to the digit line formation. In the case where the thick insulative layer is comprised only of oxide it is possible for oxygen to diffuse through the oxide. By overlying the oxide with $Si_3N_4$ it is possible to prohibit oxygen diffusion though the oxide.

Figure 4:
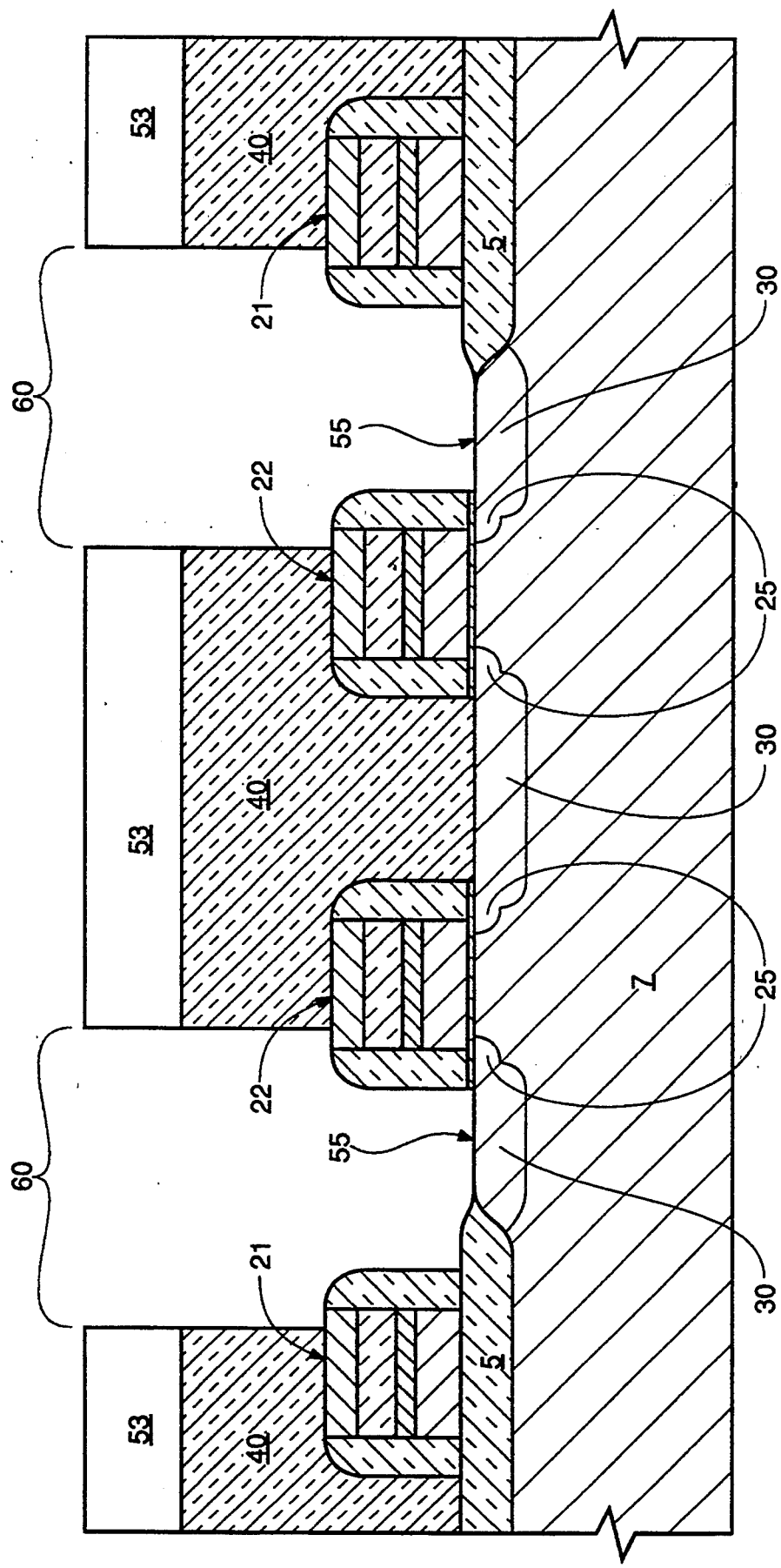

Referring to FIG. 4, mask 53 defines self-aligned substrate contact area 55. The oxide 40 is etched, preferably dry etched, to form a self-aligned openings 60 exposing the contact areas 55 of the substrate 7.

Figure 5:
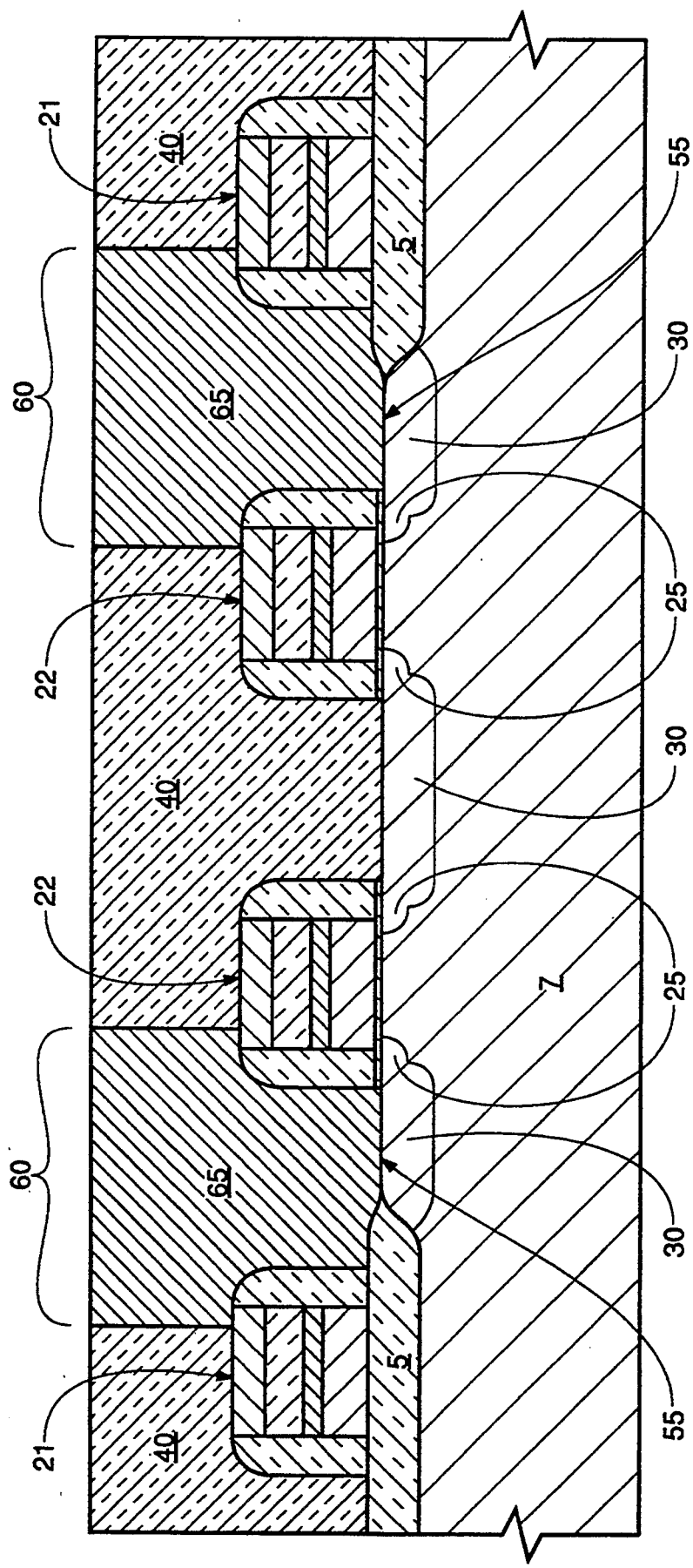

Referring to FIG. 5, in order to provide electrical communication between the substrate 7 and the storage cell capacitor a polysilicon plug 65 is formed in each opening 60. The actual method used to form the polysilicon plugs 65 is not critical, two options being a selective silicon growth from the contact area 55 or an in-situ doped polysilicon deposition and subsequent etch back or CMP back.

Figure 6:
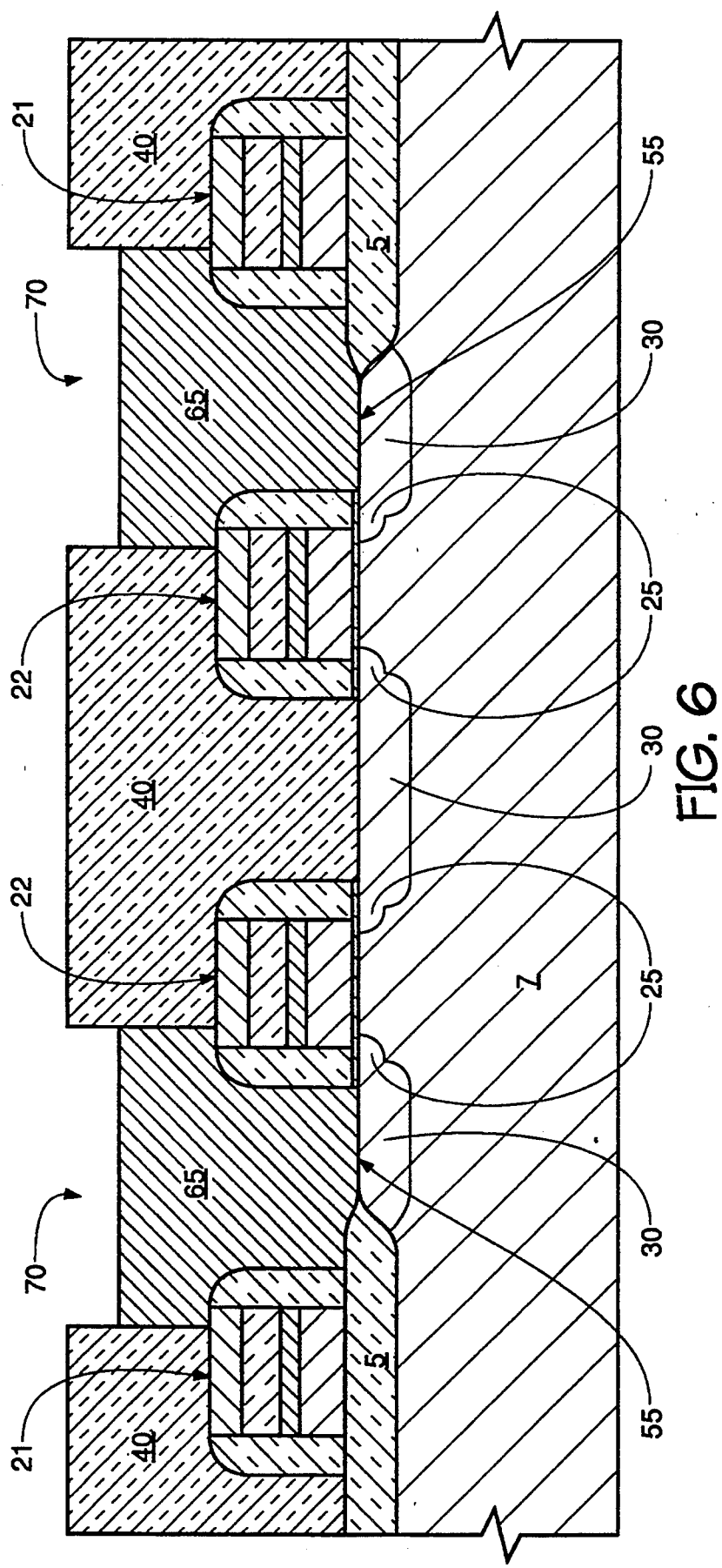

Referring now to FIG. 6, an upper portion of each polysilicon plug 65 is removed during a dry etch in order to form a recesses 70. Typically, this etch back is 50 to 400 nano meters (nm). In a case where the polysilicon plugs 65 are formed during a selective silicon growth it is possible to form the recess 70 by controlling the growth.

Figure 7:
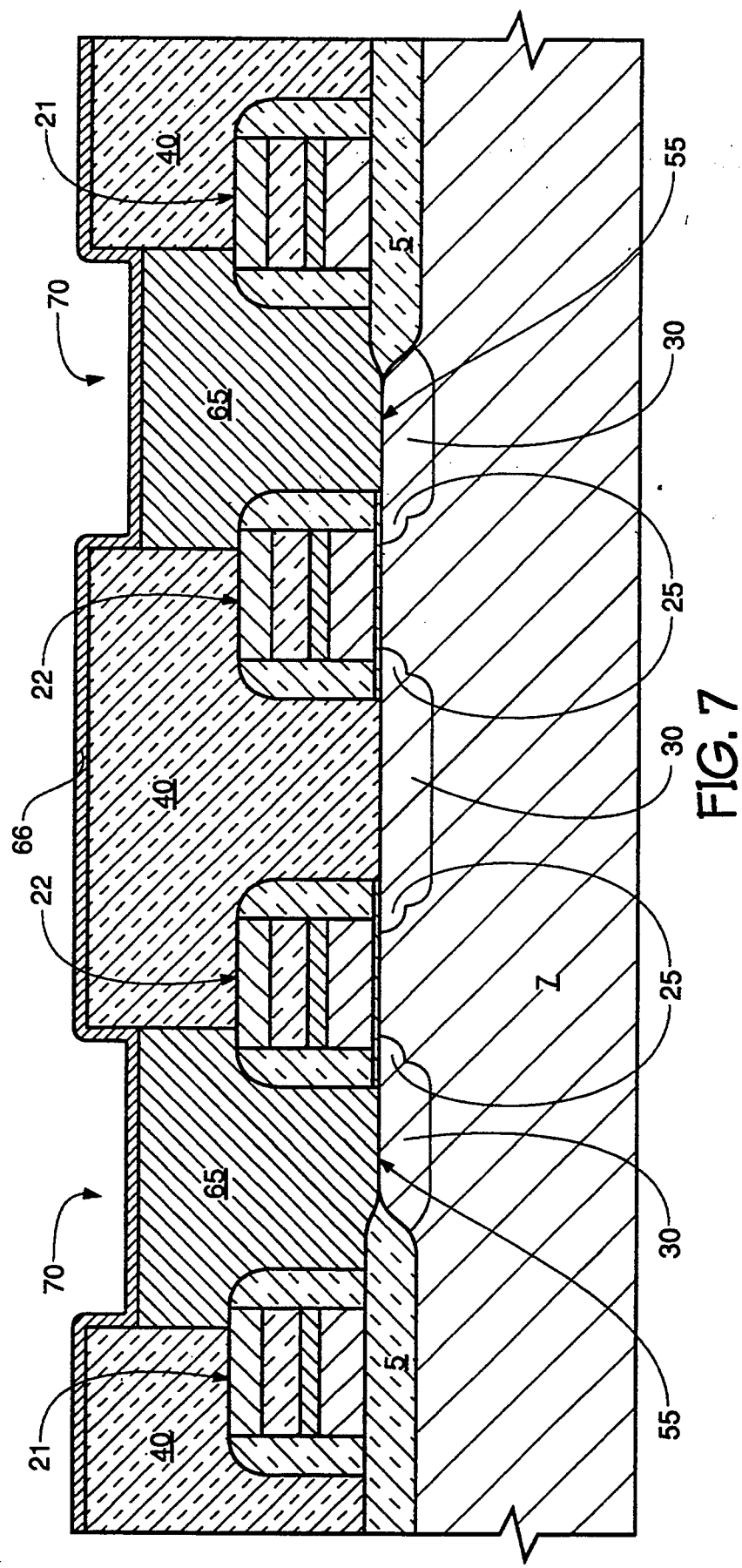

Referring now to FIG. 7, an optional first barrier layer of titanium 66 is deposited to overly oxide 40 and polysilicon plugs 65. A rapid thermal anneal is performed and the titanium 66 in contact with the polysilicon plug reacts with the polysilicon to form titanium silicide. It is possible to perform the anneal in nitrogen. In this case the titanium still reacts with the polysilicon to form titanium silicide, and the titanium which is not in contact with the polysilicon plug reacts with the nitrogen to form TiN. In addition a thin layer of nitrogen is formed overlying the titanium silicide.

In addition to titanium other refractory metals may be used. These refractory metals may be chosen from the list of refractory metals comprising W, Co, Ta, and Mo.

Alternately a metal nitride, such as TiN, may be deposited instead of a refractory metal. The refractory metal and the metal nitride are both capable of reacting with the polysilicon plug to form a silicide during an anneal.

Figure 8:
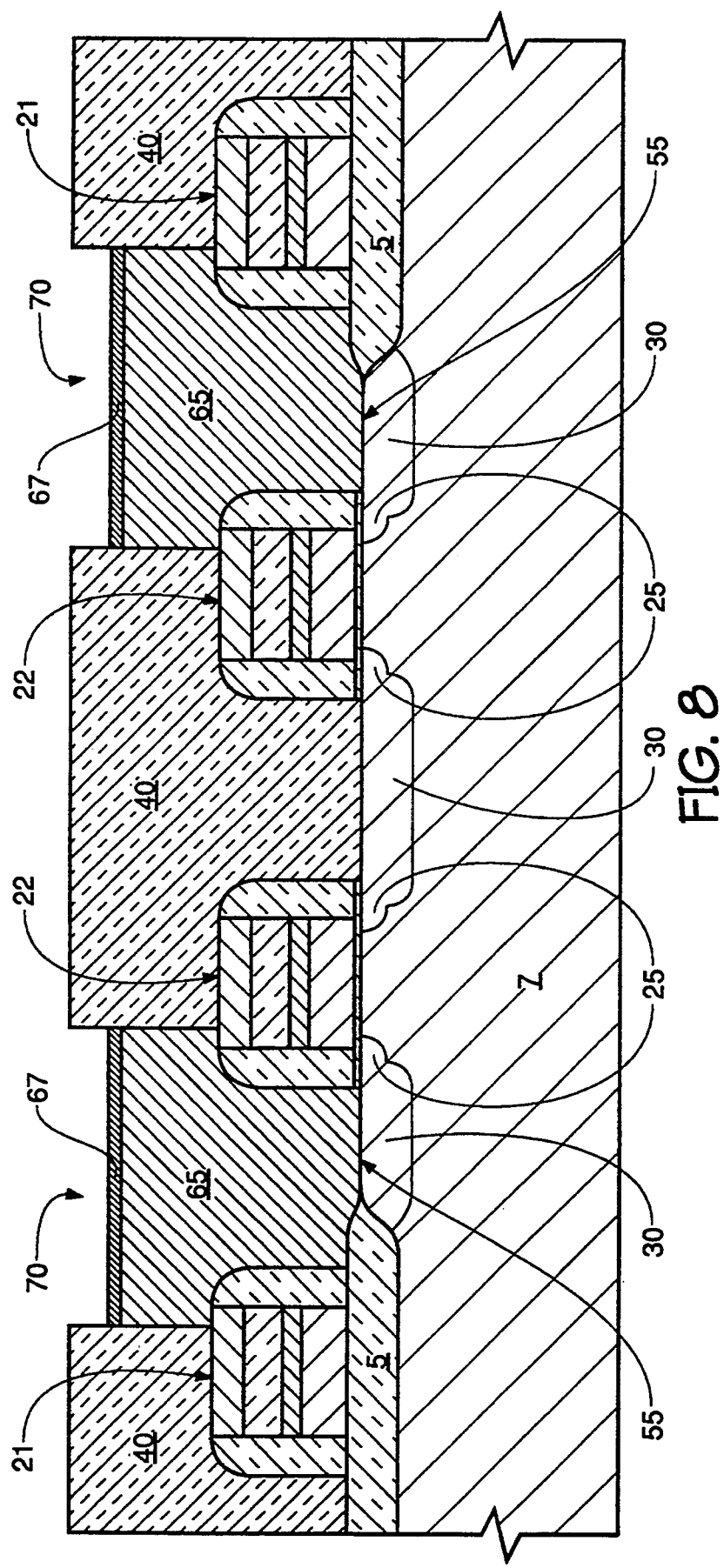

Referring now to FIG. 8, the unsilicided layer (the unreacted titanium, in the case of a non-nitrogen anneal, or the TiN, in the case of a nitrogen anneal) and the thin nitrogen layer have been removed during a wet etch. The titanium silicide 67 overlying the polysilicon plug 65 is retained during the etch. Although the titanium silicide is optional the remaining drawings include the titanium silicide layer 67.

Figure 9:
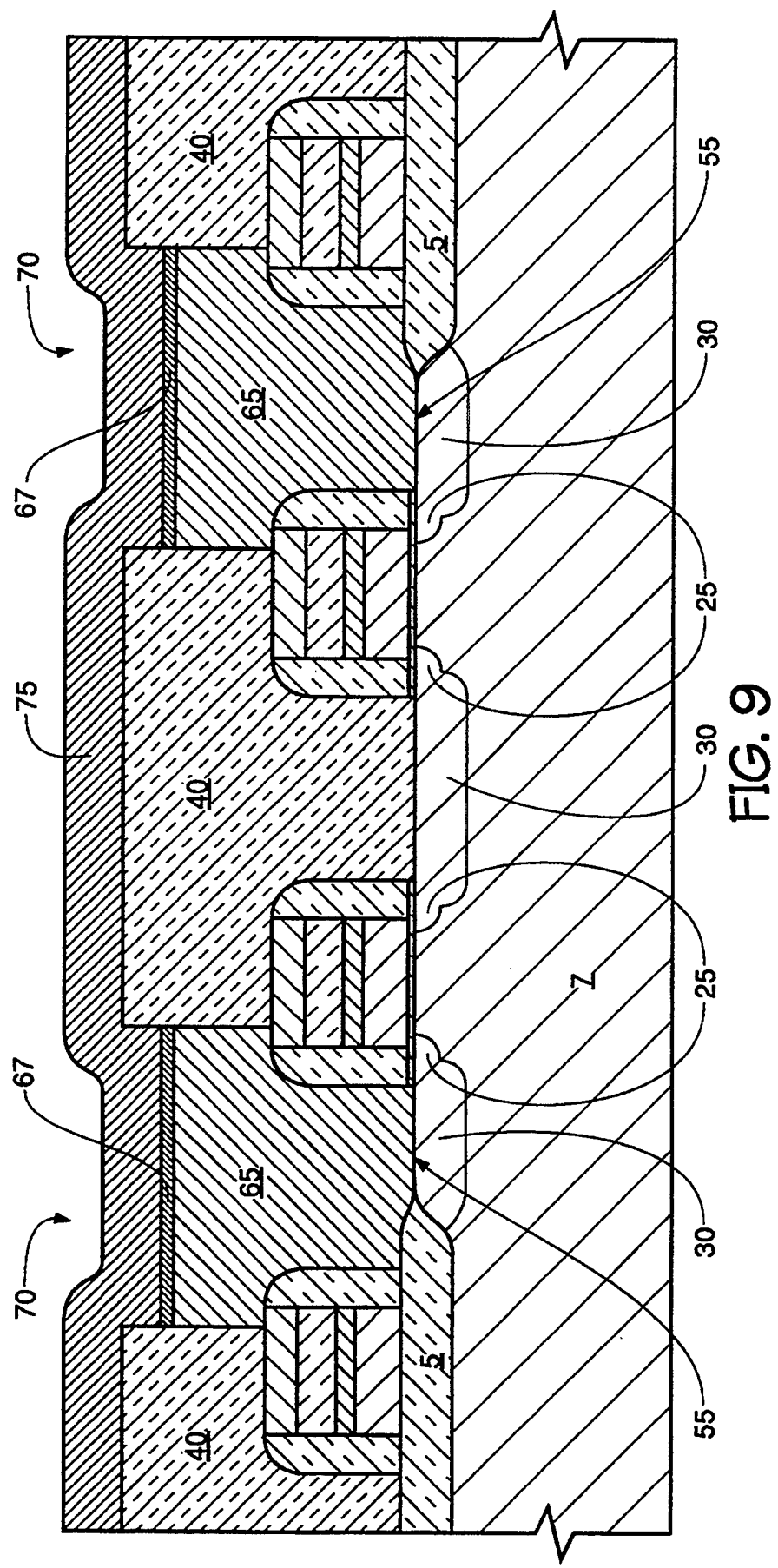

Referring to FIG. 9, a second barrier layer, titanium nitride layer 75, is formed by a chemical vapor deposition (CVD) or a sputtering process performed at room temperature. The titanium nitride layer 75 typically has a thickness greater than or equal to the depth of recess 70 remaining after the removal of the unsilicided titanium 66. The titanium silicide layer lowers a contact resistance between the polysilicon plug 65 and the titanium nitride layer 75 and reduces degradation of the titanium nitride layer 75 during BST deposition. The titanium nitride layer 75 provides a barrier against silicon diffusion of the polysilicon plug 65 and the titanium silicide layer 67 during subsequent high temperature anneals. Other materials may be used in place of titanium nitride. These materials may be chosen from refractory metals, conductive metal oxides or metal nitrides and must be capable of prohibiting silicon diffusion. Some examples include tantalum, TaN, Ti, $RuO_2$, and Ru.

Figure 10:
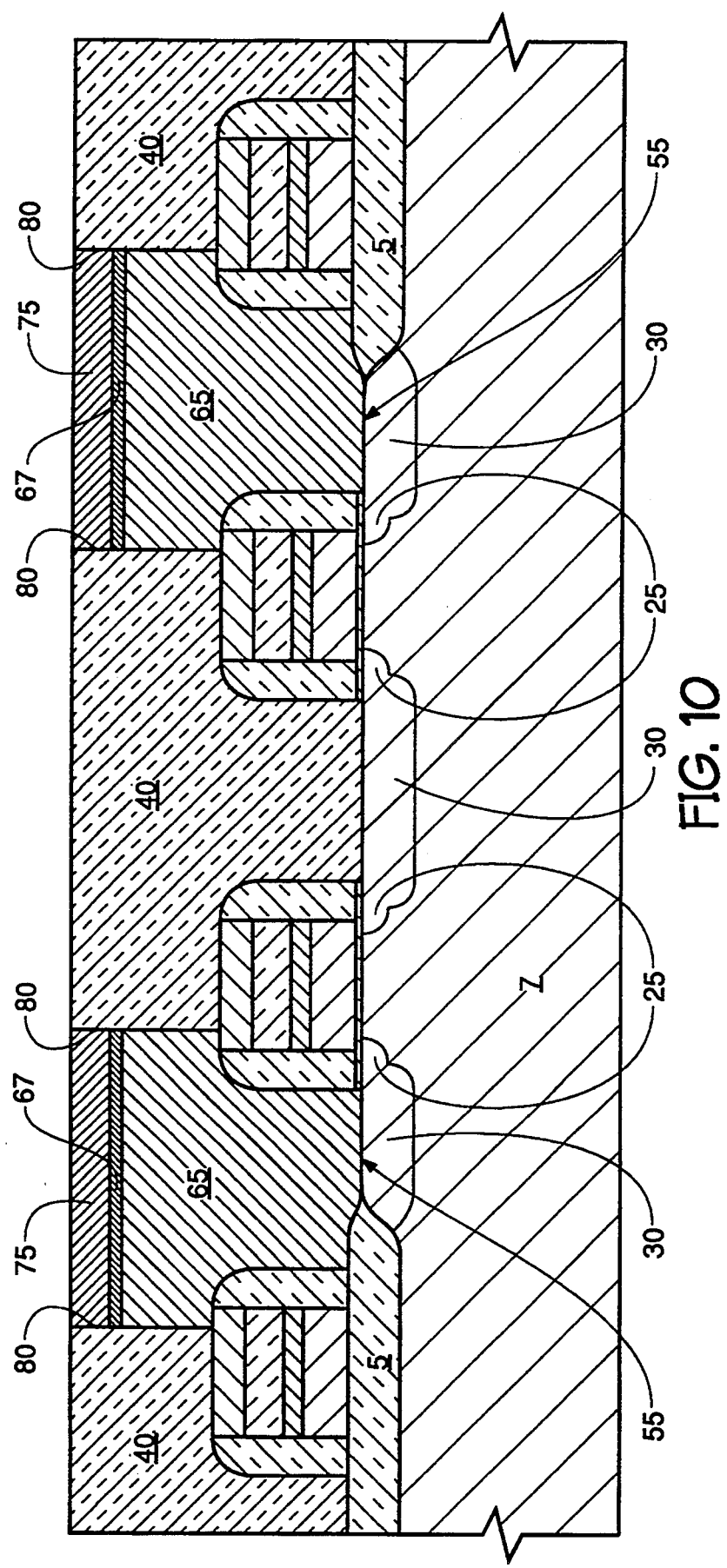

Referring to FIG. 10, the titanium nitride layer 75 of FIG. 9 is planarized, preferably by CMP, in order to expose the oxide layer 40 and in order to retain titanium nitride 75 in recesses 70 overlying the titanium silicide 67. Portions of the oxide layer 40 may be planarized during this step. It is important, of course to retain a sufficient depth of titanium nitride 75 in order to inhibit silicon diffusion of the polysilicon plugs 65 and titanium silicide 67. It can be seen that only the upper surface of the titanium nitride layer 75 is exposed and that the titanium nitride sidewalls 80 are protected by the oxide layer 40.

At this juncture the invention can take alternate paths. By following one path a crown type storage node capacitor is formed, and by following the second path a planar type storage node capacitor is formed. FIGS. 11 through 15A and 15B depict the steps of the method for forming the crown capacitor, and FIGS. 16 through 19 depict the steps of the method for forming the planar capacitor.

Figure 11:
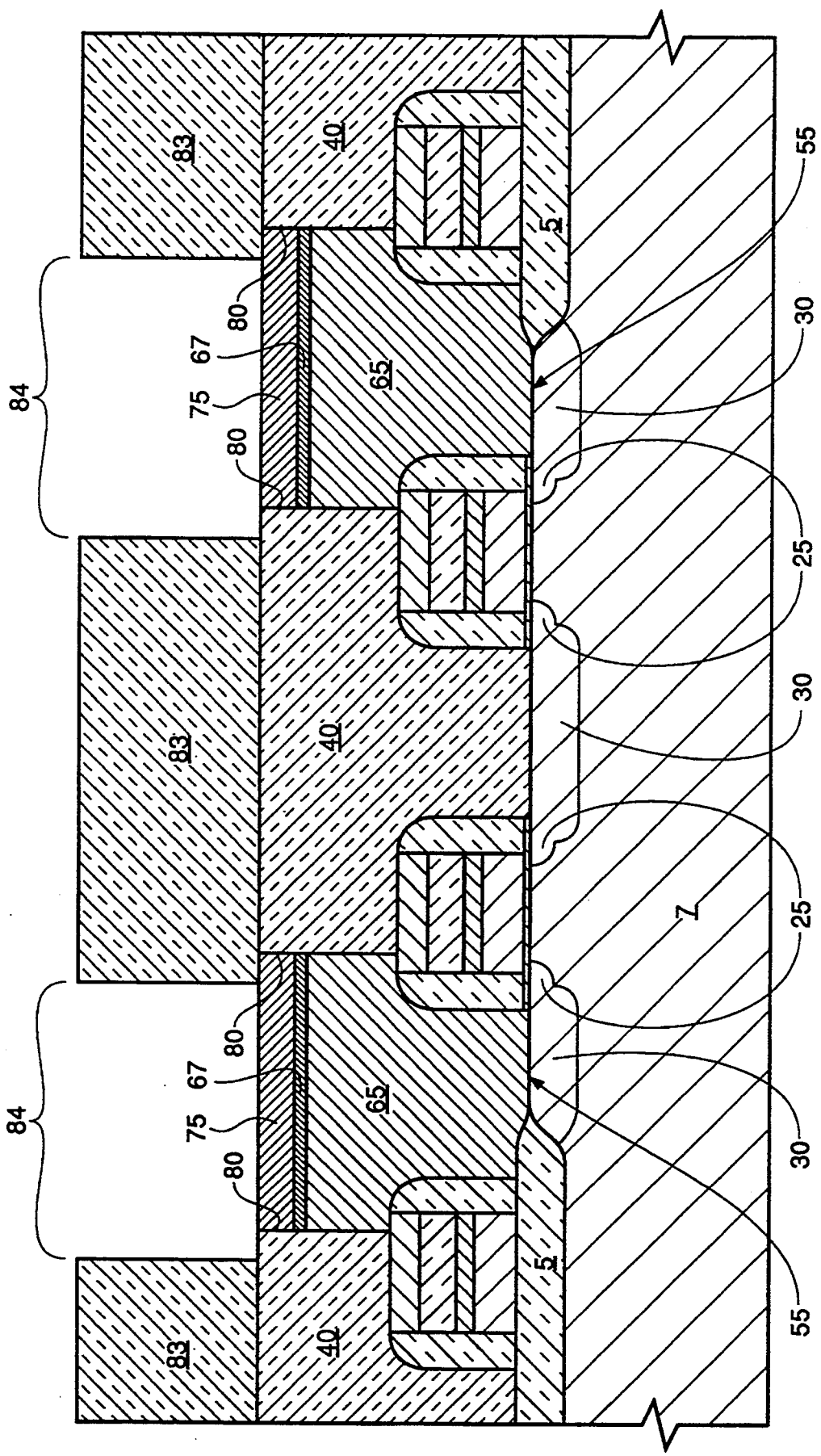

Referring to FIG. 11, a thick second insulative layer 83 is deposited, patterned and etched to expose at least a portion of the titanium nitride layer 75. It is not important that opening 84 be precisely aligned with the titanium nitride layer 75. The second insulative layer 83 may be selected from the list of insulative materials comprising oxide, nitride and oxynitride. As was the case for the first insulative layer the second insulative layer may actually be formed by depositing two separate insulative layers. For example nitride can be deposited to overly the first insulative layer and oxide can then be deposited to overly the nitride.

Figure 12A:
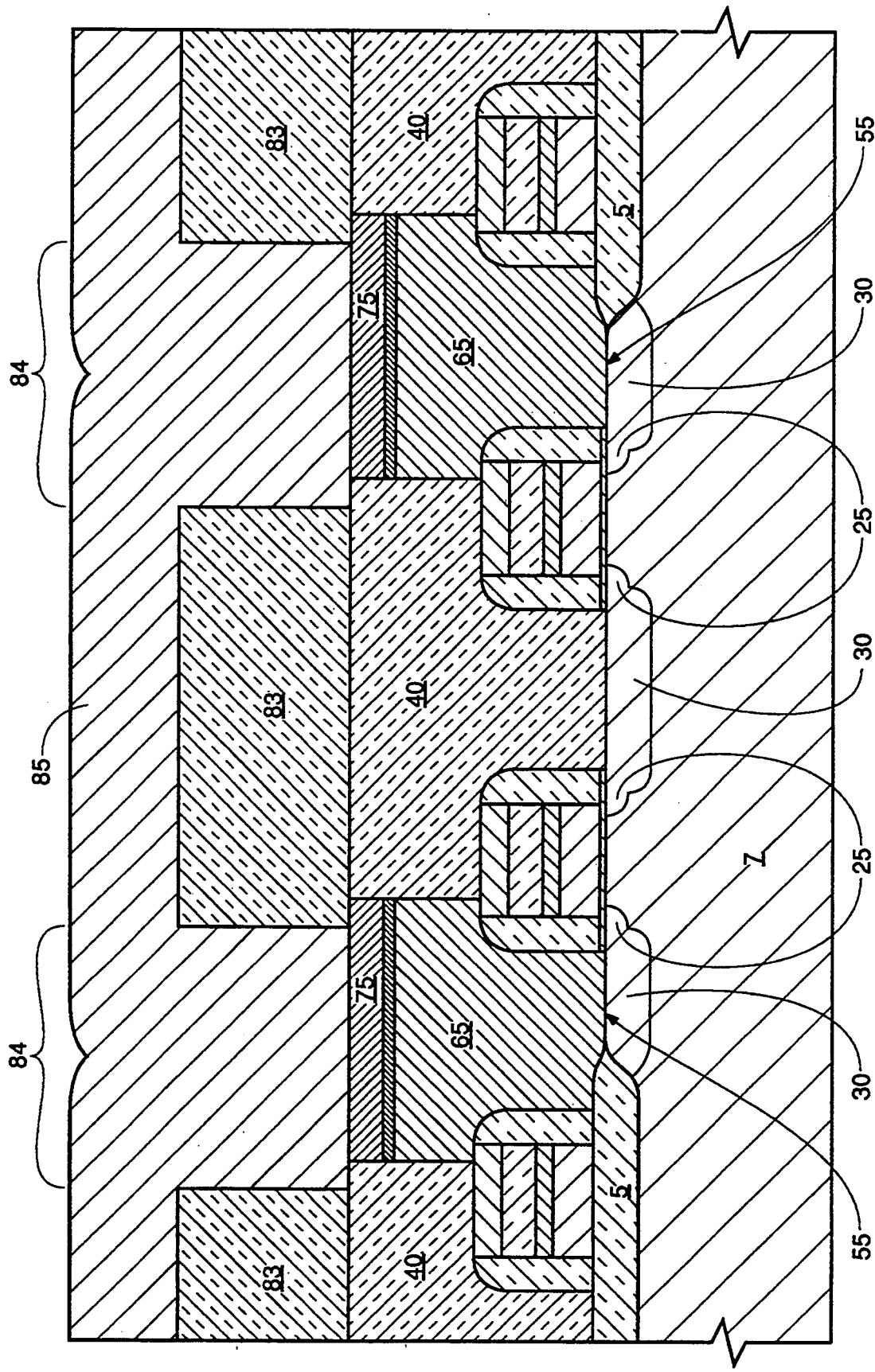
FIGS. 12A and 12B are wafer portions of FIG. 11 following the deposition of a platinum layer.
Figure 12B:
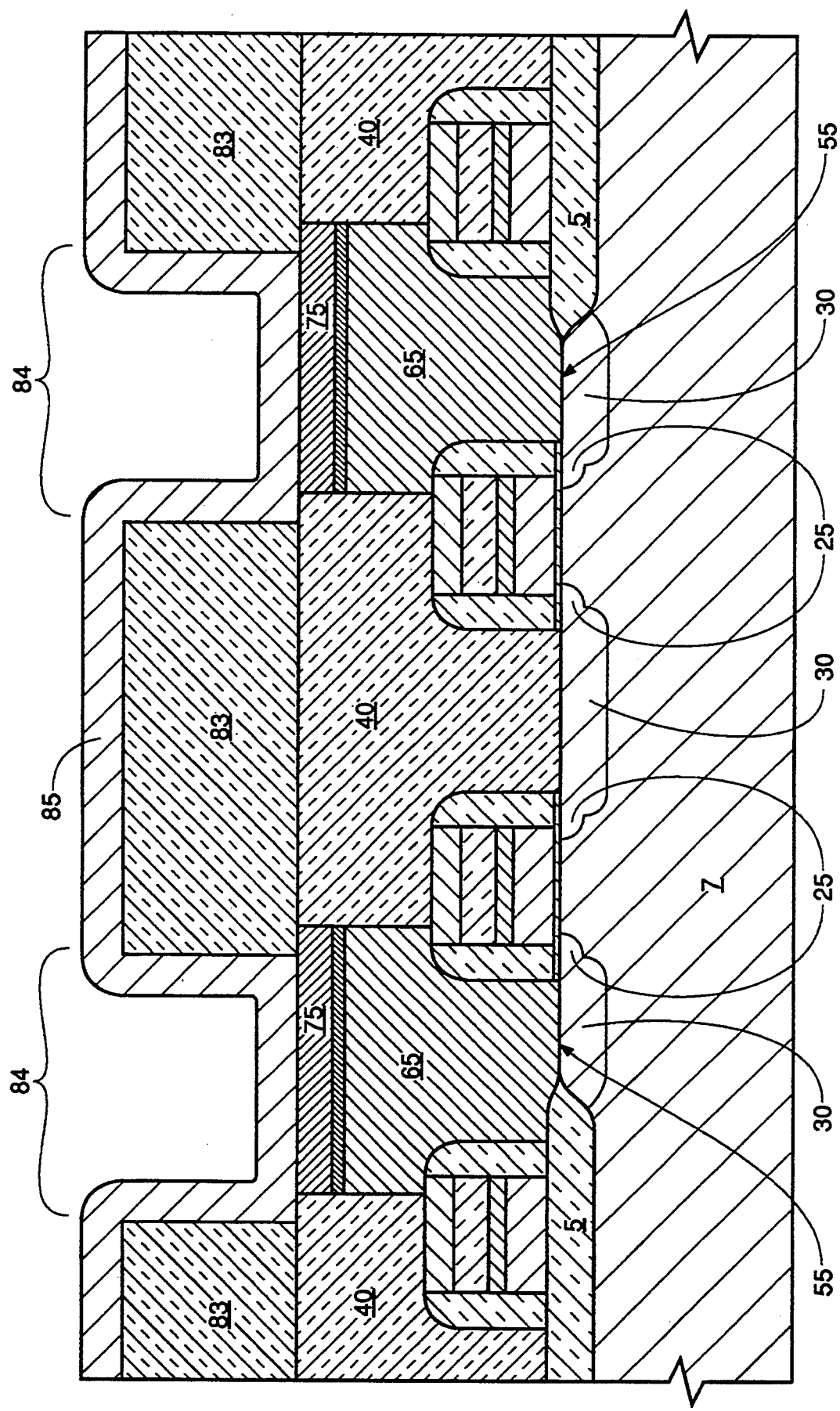

Referring to FIGS. 12A and 12B a platinum layer 85 is formed at room temperature preferably by chemical vapor deposition (CVD) or alternately by a sputtering technique. The platinum layer 85 overlies the second insulative layer 83 and exposed portions of the titanium nitride layer 75 shown in FIGS. 11. Since the platinum layer 85 is resistant to oxidation it provides an excellent surface for the deposition of the high dielectric constant material. In addition, the platinum layer 85 protects the top surface of the titanium nitride 75 from strong oxidizing conditions during the BST deposition. Therefore platinum is used as the upper portion of the first electrode since it will not oxidize during a BST deposition or subsequent anneals. An electrode that oxidizes would have a low dielectric constant film below the BST, thereby negating the advantages provided by the high dielectric constant material. The titanium nitride layer 75 is introduced to avoid Si and Pt inter-diffusion thereby preventing the formation of $SiO_2$ on top of the platinum surface. Other materials which are resistant to oxidation may be used in place of the platinum. For example, $RuO_2$ as well as other non-oxidizing materials nay be used. In the parent application it was erroneously stated that TiN could also be used. However, TiN cannot be used in place of platinum in this application.

Since the titanium nitride layer 75 is recessed in the oxide layer 40, a thick layer of platinum may be deposited thereby increasing the capacitive area as a result of sidewall contribution. This is accomplished without decreasing the density of the device.

In FIG. 12A the platinum layer 85 is relatively thick and completely fills the openings 84 formed during the removal of the second insulative layer 83 to expose portions of the titanium nitride layer 75. In this case the platinum is typically deposited from at least a thickness of 0.1 micro meter to a thickness of 0.3 micro meter.

In FIG. 12B the platinum layer 85 is relatively thin and does not fill the openings 84 but rather coats the sidewalls and the bottom of the openings 84. In this case the platinum is typically deposited in the range of thicknesses from at least 10 nano meters to 100 nano meters.

Figure 13A:
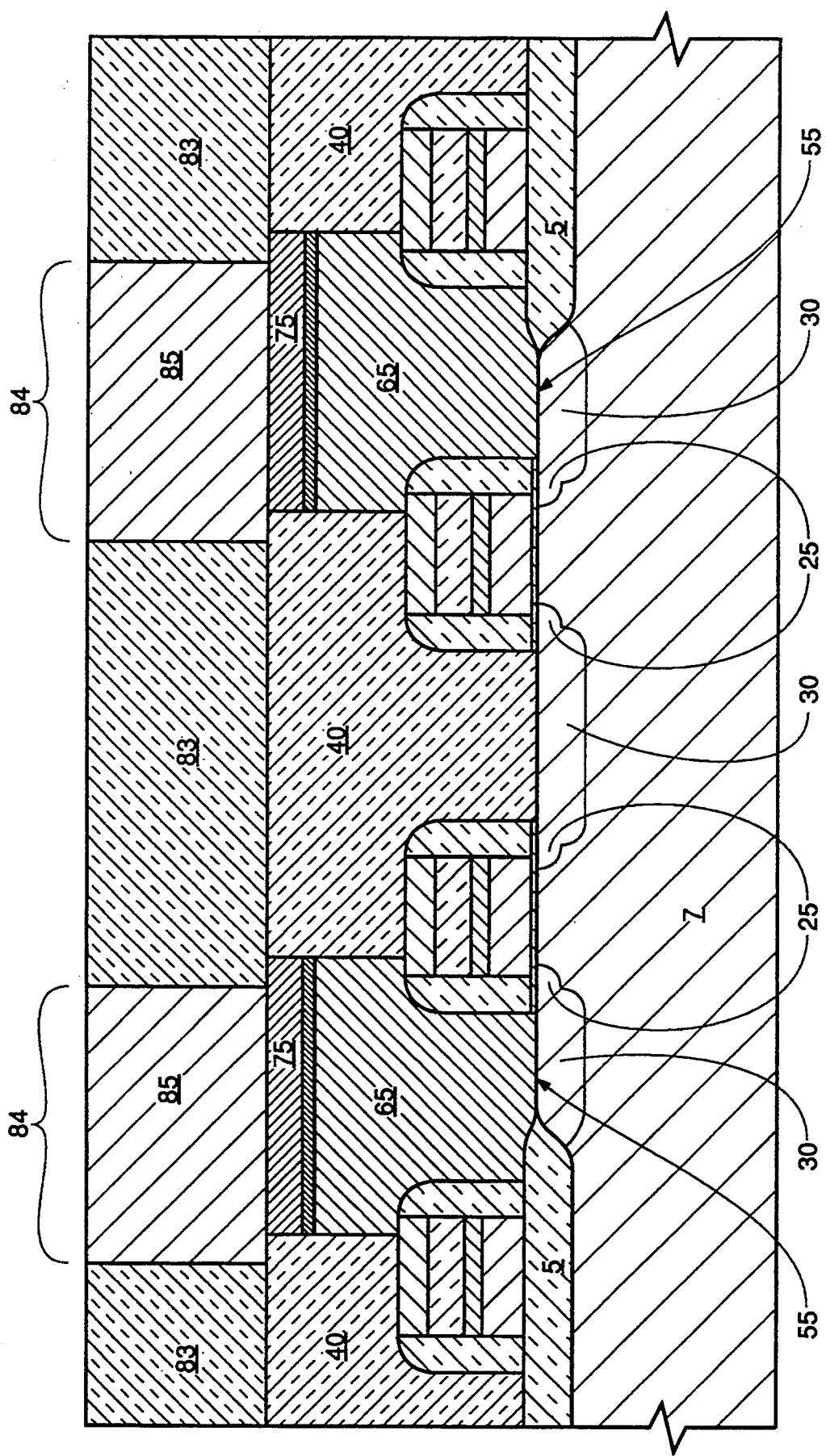
FIGS. 13A and 13B are the wafer portions of FIG. 12A and 12B respectively following the planarization of the platinum layer to expose the second insulative layer.
Figure 13B:
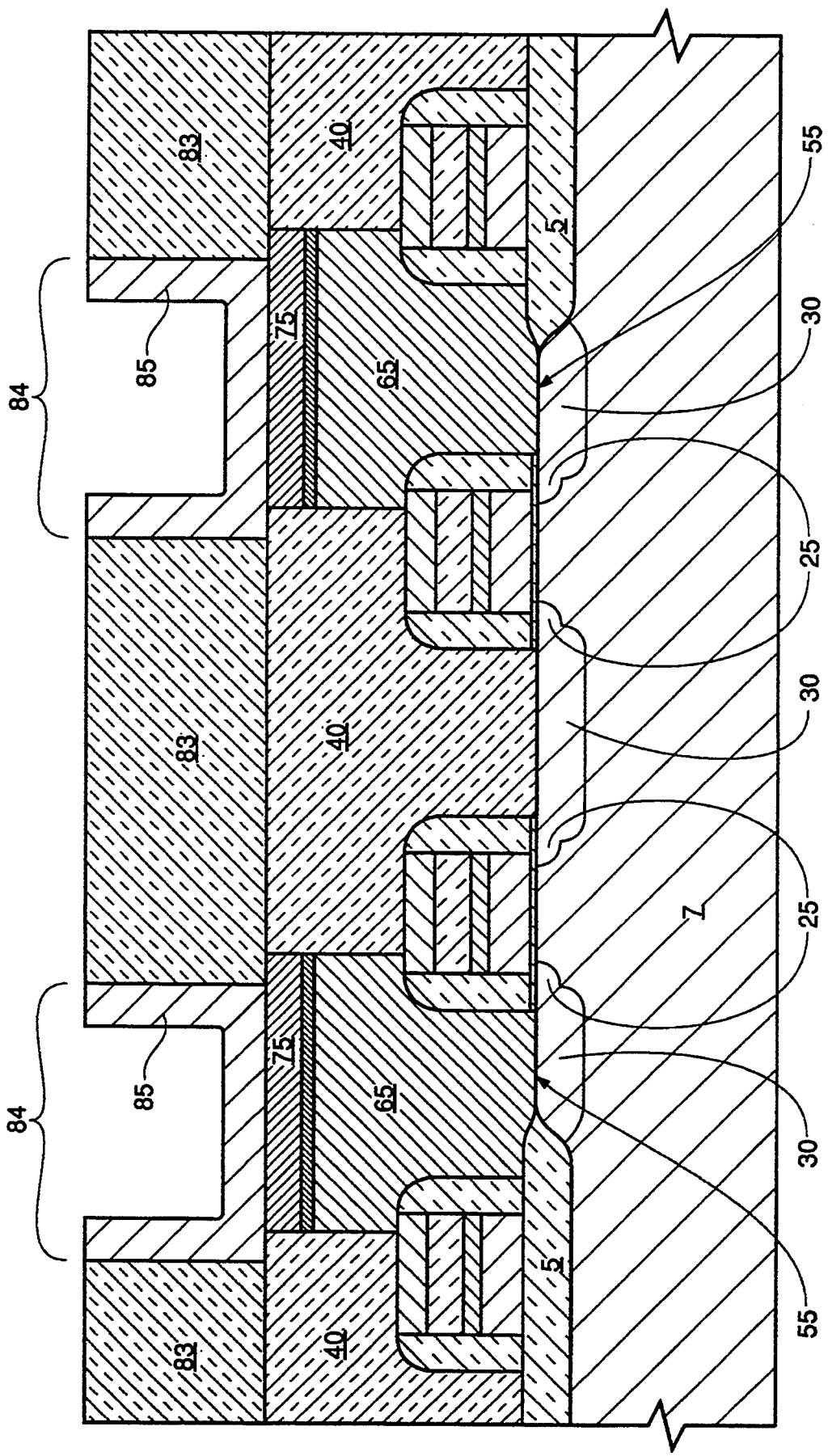

Referring to FIGS. 13A and 13B, the platinum layer 85 has been removed with a dry etch back using Hbr gas for the thick platinum 85 of FIG. 13A and by chemically mechanically planarization (CMP) for the thin platinum 85 of FIG. 13B. Portions of the second insulative layer 83 may also be removed during the removal of portions of the platinum layer 85.

By using a very thick second insulative layer 83 thick platinum electrodes are fabricated, and the capacitance area is increased by the sidewall area contribution. Therefore, the second insulative layer is deposited from at least a thickness of 0.2 micro meters to a thickness of 1.0 micro meters.

Figure 14A:
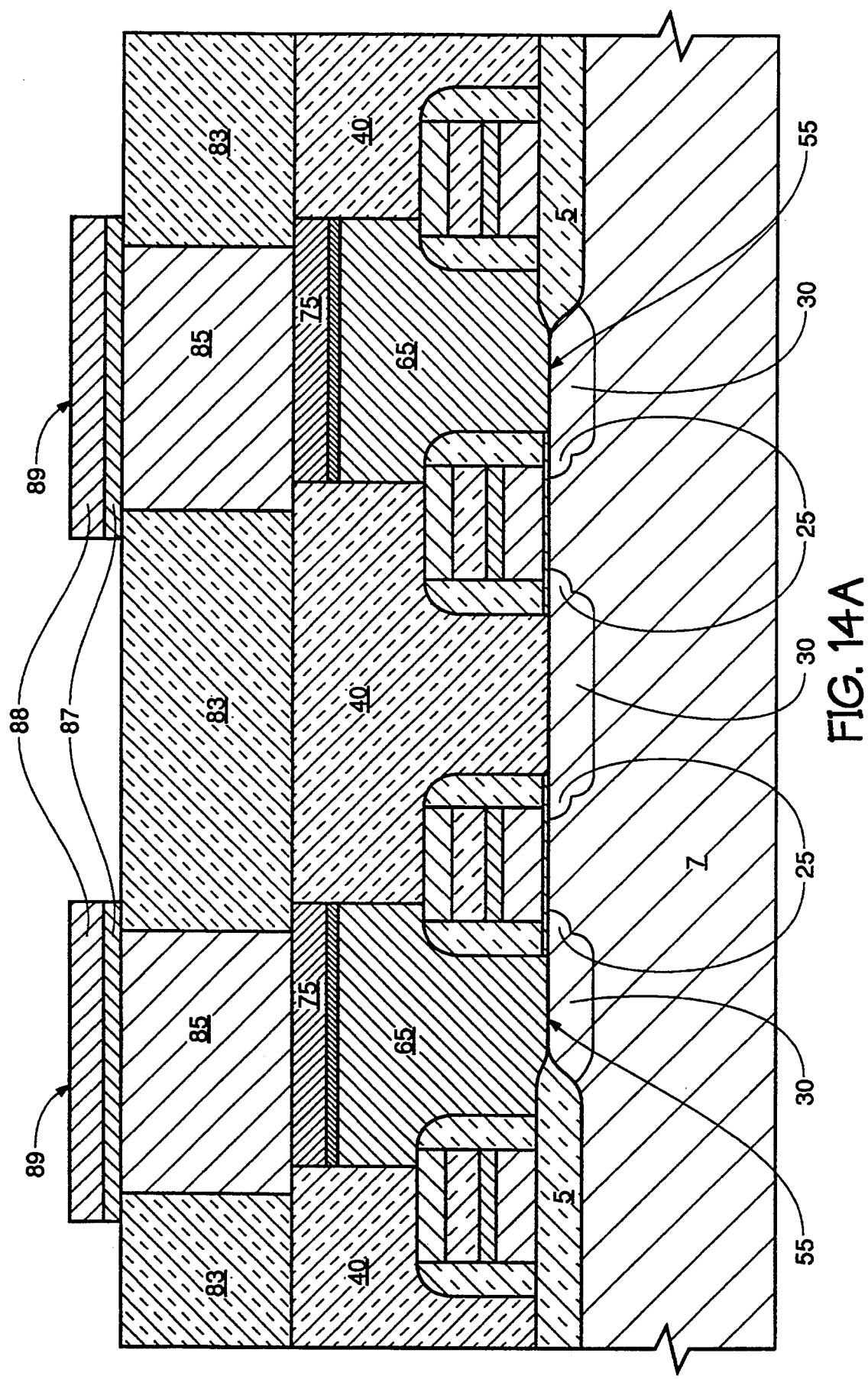
FIGS. 14A and 14B are wafer portions of FIGS. 13A and 13B respectively following the deposition of a high dielectric constant material layer and the deposition of a cell plate layer and following the patterning of these layers to complete the formation of the storage cell capacitor.
Figure 14B:
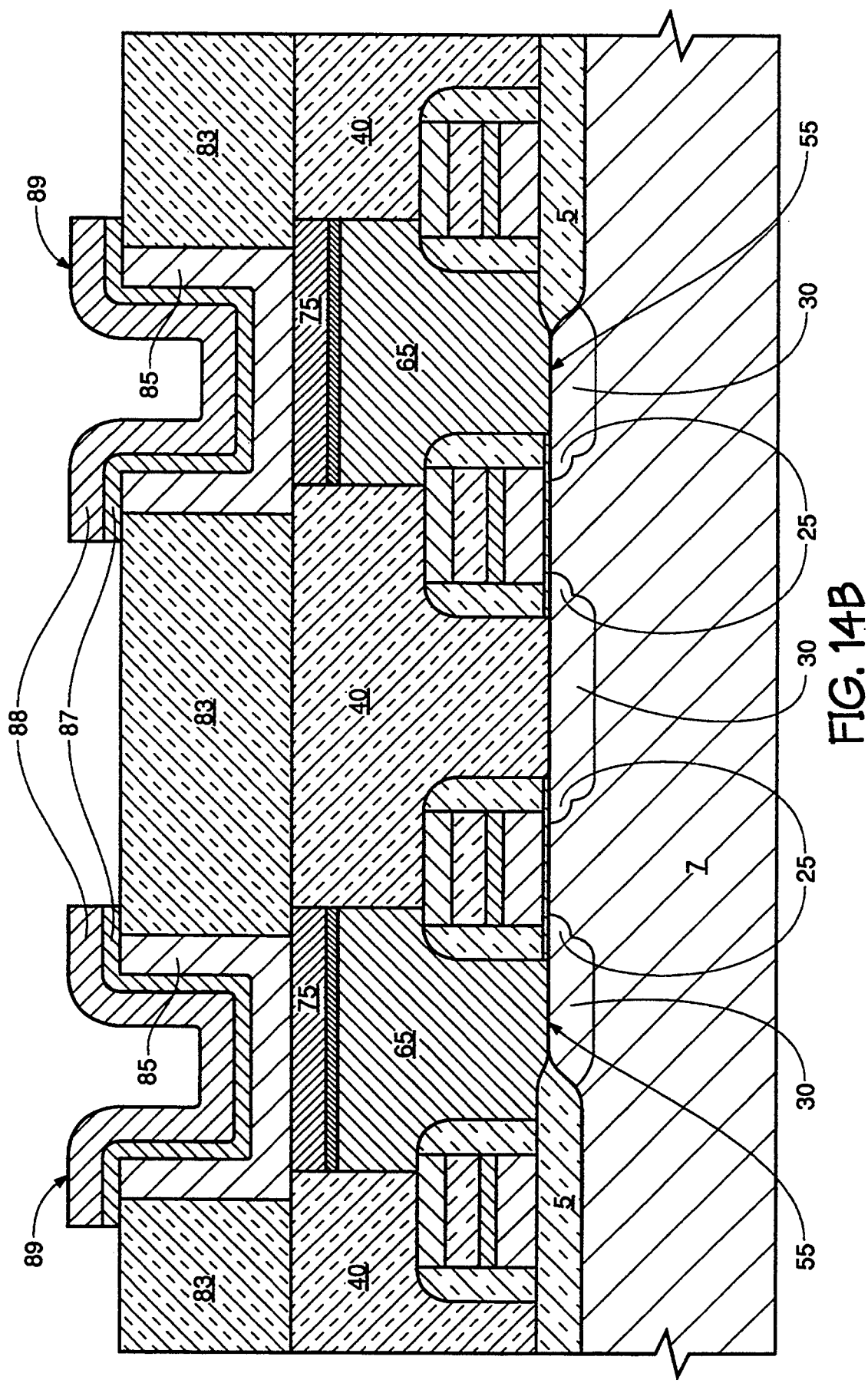

FIGS. 14A and 14B depict the wafer of FIGS. 13A and 13B respectively following the depositions, patterning, and etch of a dielectric layer 87, having a high dielectric constant, and a cell plate layer 88 to form storage node capacitors 89.

Figure 15A:
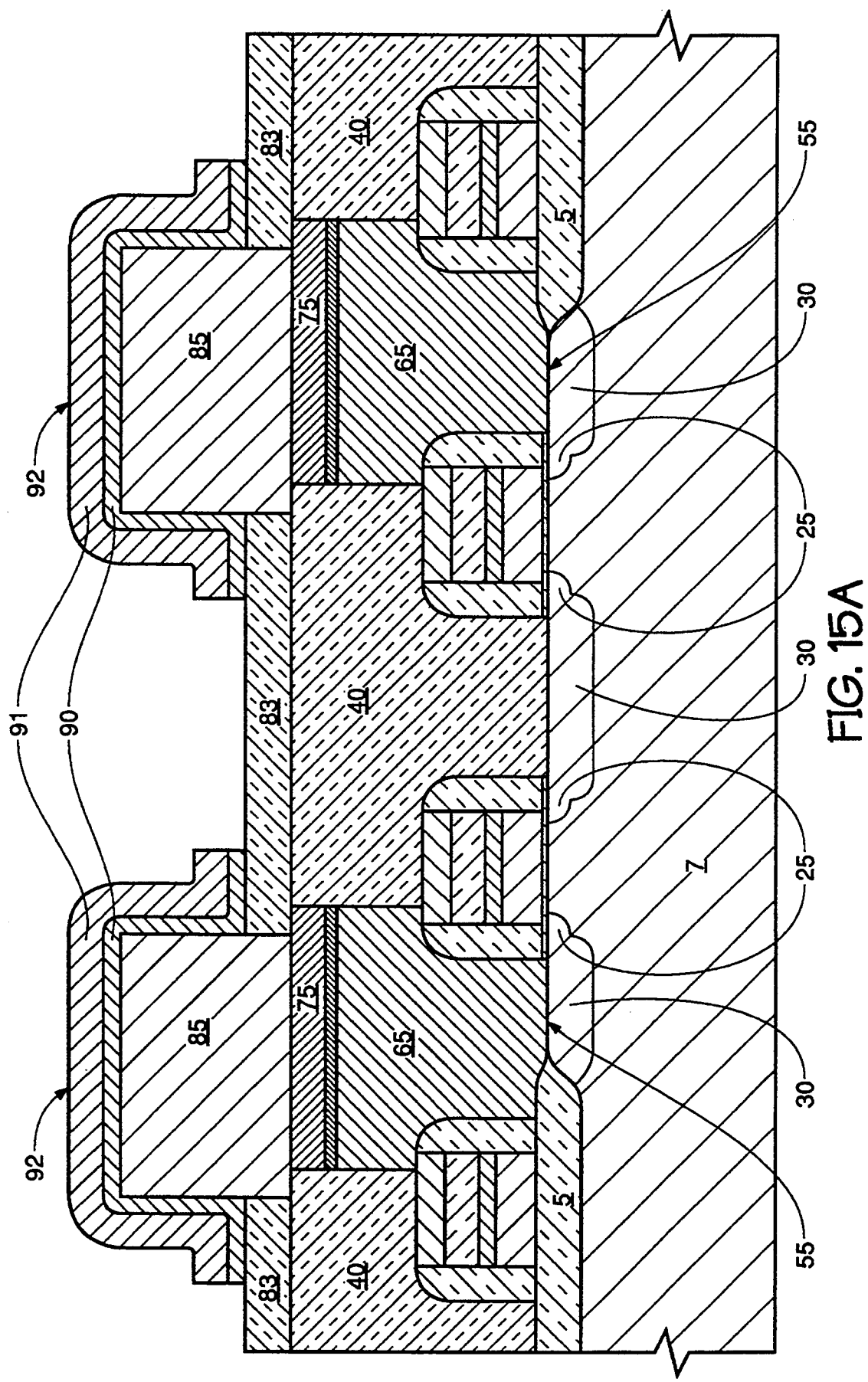
FIGS. 15A and 15B are wafer portions of FIGS. 13A and 13B respectively following the removal of a portion of the second insulative layer and following the deposition of a high dielectric constant material layer and the deposition of a cell plate layer and following the patterning of these layers to complete the formation of the storage cell capacitor.
Figure 15B:
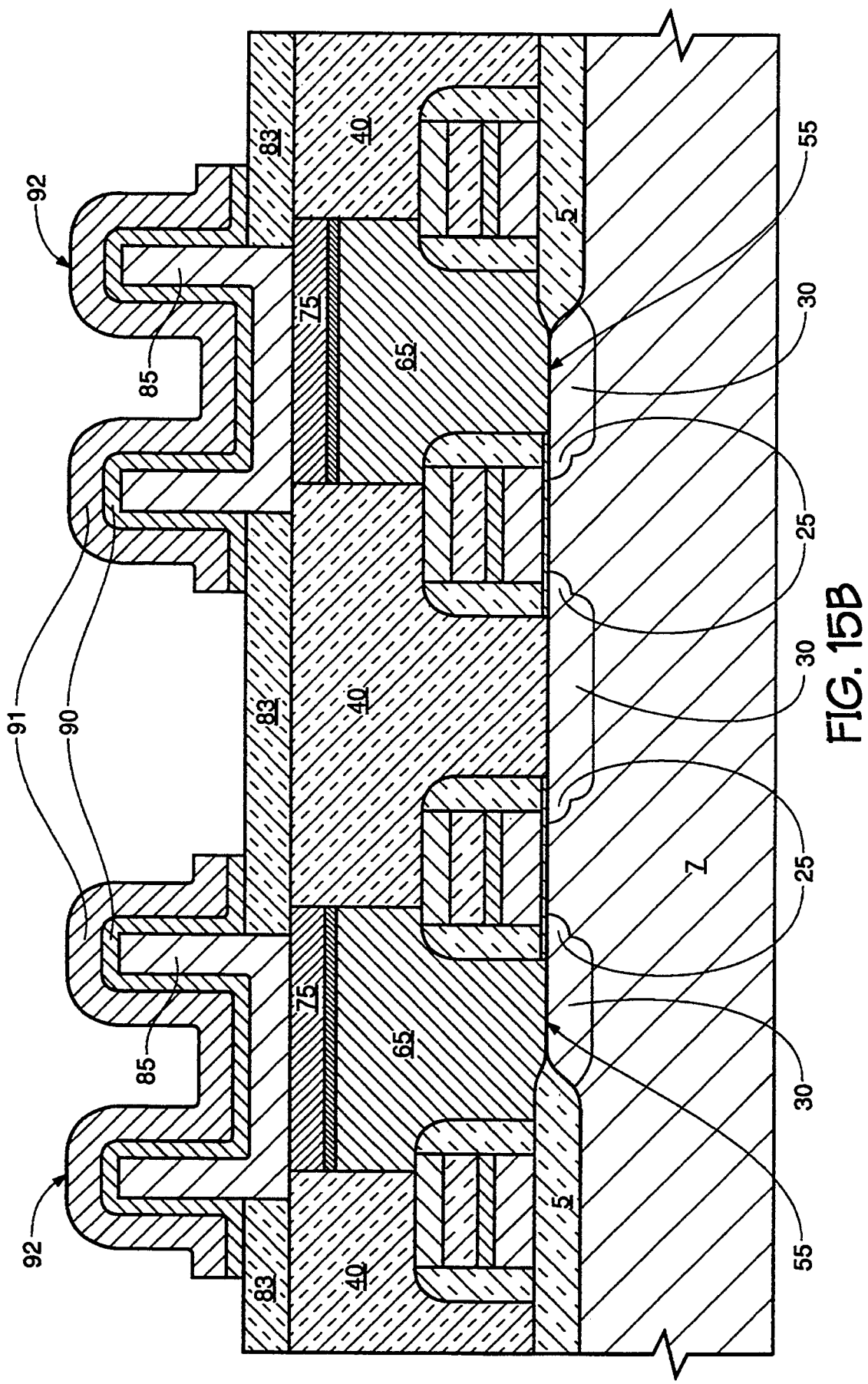

Referring to FIGS. 15A and 15B, portions of the second insulative layer 83 have been etched to expose larger portions of the platinum layer 85, thereby increasing capacitance. However, it is important to note that the etch is controlled in order to retain a portion of the insulative layer 83. The portion of the insulative layer must be retained to protect the titanium nitride layer 75 net covered by the platinum layer 85 during the deposition of dielectric layer 90. In the case where the second insulative layer is actually two separate layers, the last layer deposited can be selectively removed over the first deposited layer, as long as it was selected to be etchable over the first deposited layer. Therefore, in the example given, wherein oxide is deposited to overly nitride, the oxide is removed. In FIGS. 15A and 15B, the dielectric layer 90 and cell plate layer 91 have been deposited, patterned and etched to form storage node capacitors 92. Dielectric layer 90 is typified as having a high dielectric constant.

A very thick second insulative layer 83 increases the sidewall area contribution thereby increasing capacitance. This can be seen by examination of the embodiments of the invention depicted in FIGS. 14A though 15B.

The storage node plate of storage node capacitors 89 and 92 can be thought of as comprising just the platinum portion 85 or a combination of the platinum portion 85, the titanium nitride layer 75, the titanium silicide layer 67, and the polysilicon plug 65. Some people like to think of the polysilicon plug as an electrical interconnect to the substrate rather than as a portion of the storage node electrode.

Figure 16:
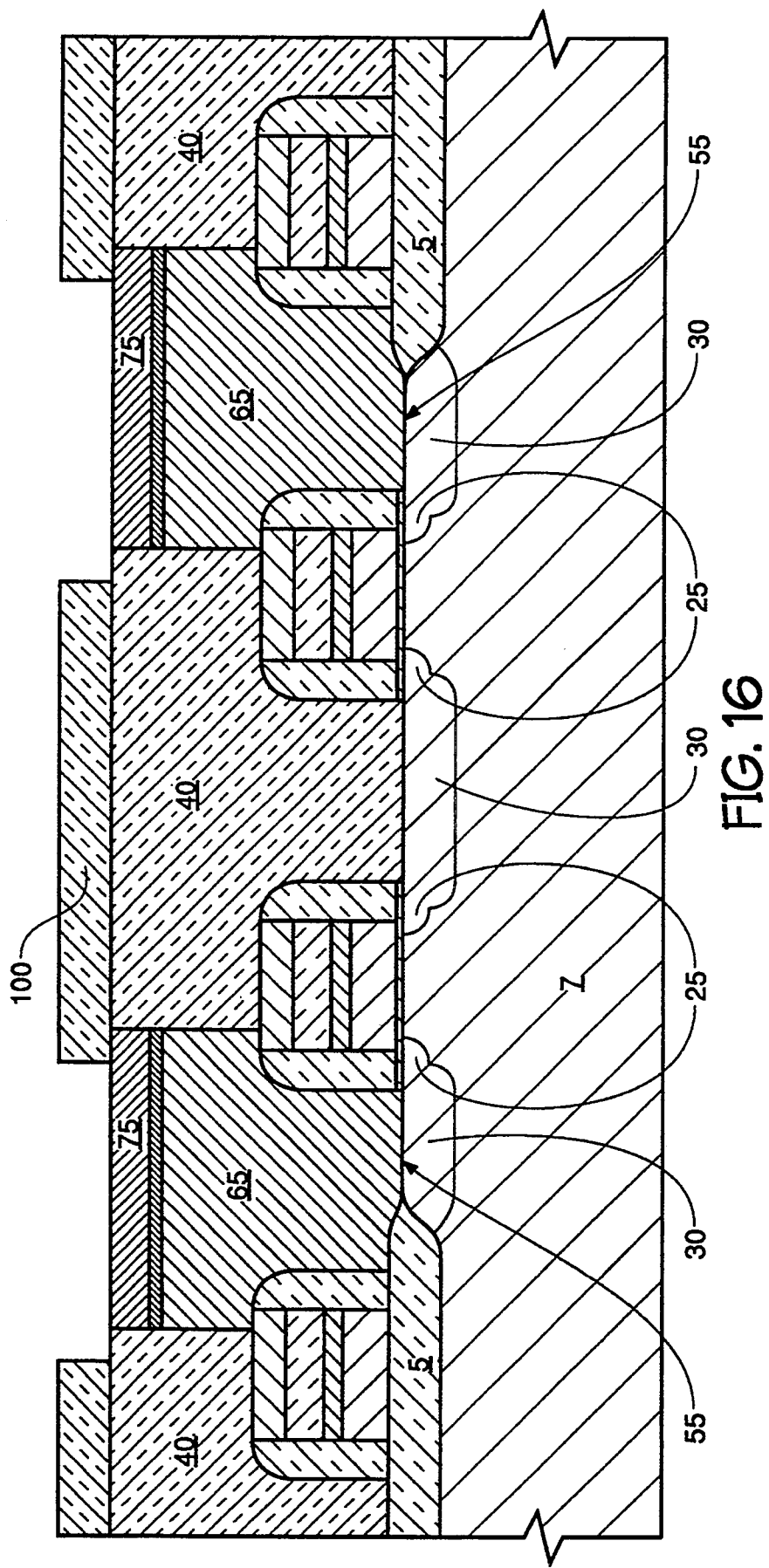

FIG. 16 is the wafer portion of FIG. 10 following the deposition, patterning, and etching of a thin second insulative layer 100. The etching exposes at least a portion of the titanium nitride layer 75. The second insulative layer 83 may be selected from the list of insulative materials comprising oxide, nitride and oxynitride.

Figure 17:
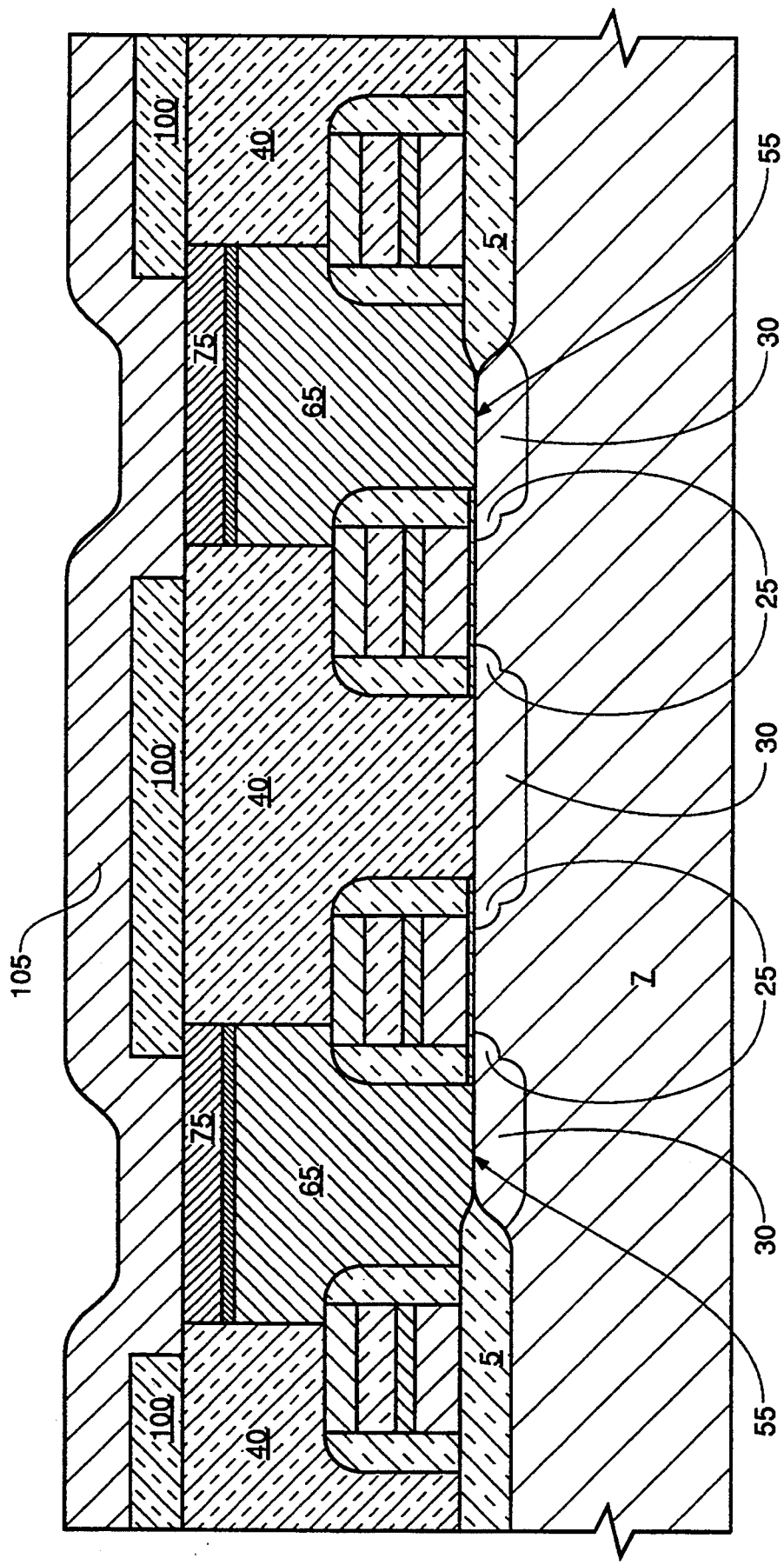

Referring to FIG. 17, a platinum layer 105 is formed preferably by chemical vapor deposition (CVD) or alternately by a sputtering technique. The platinum layer 105 overlies the second insulative layer 83 and exposed portions of the titanium nitride layer 75 shown in FIGS. 11. The properties and functions of the platinum layer 105 are the same as those of platinum layer 85 and therefore are not described again. As was the case in the previous embodiment other non-oxidizing conductive materials may be used in the place of platinum.

Figure 18:
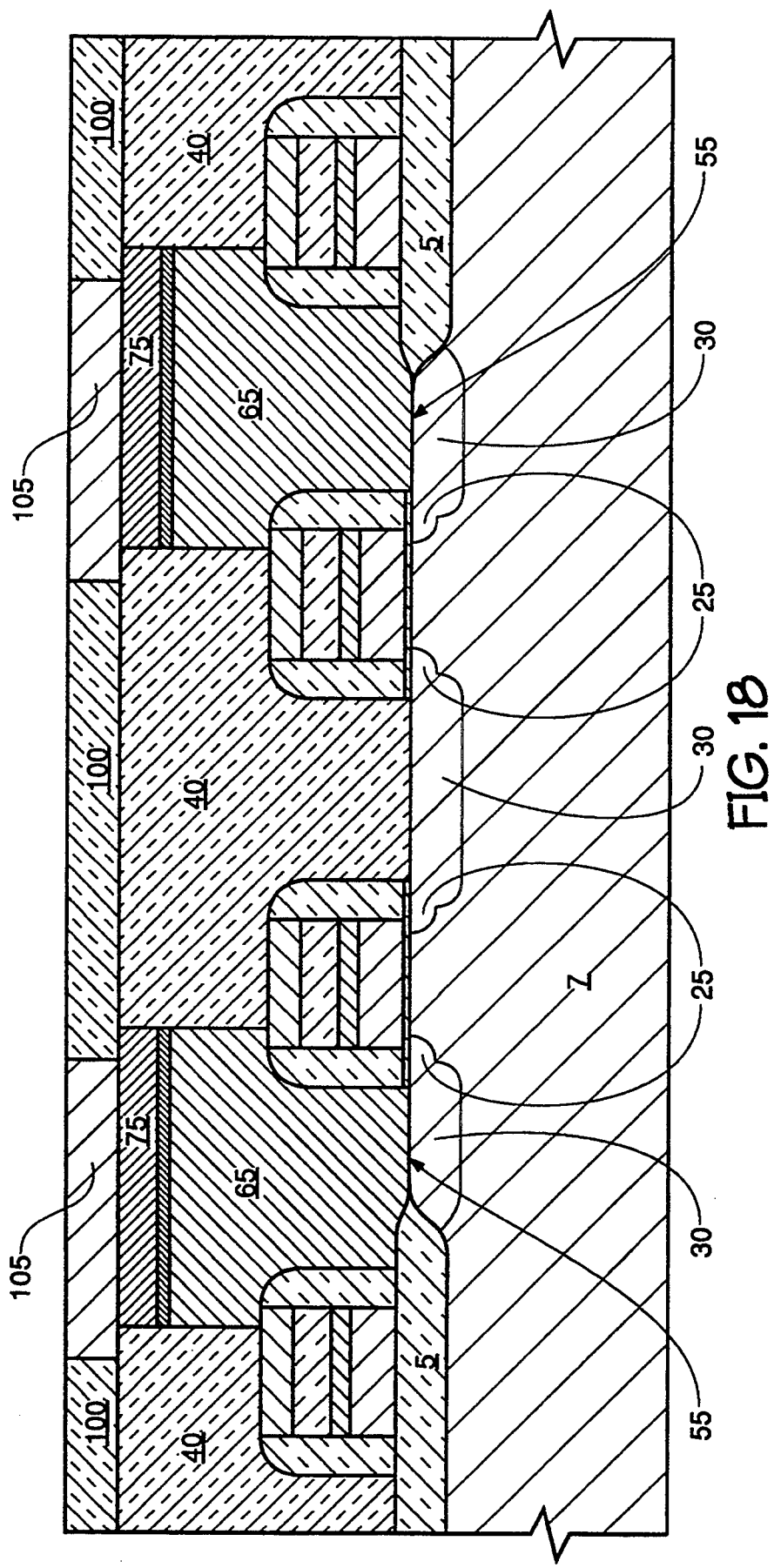

Referring to FIG. 18, the platinum layer 105 has be removed during CMP to expose the second insulative layer 100.

Figure 19:
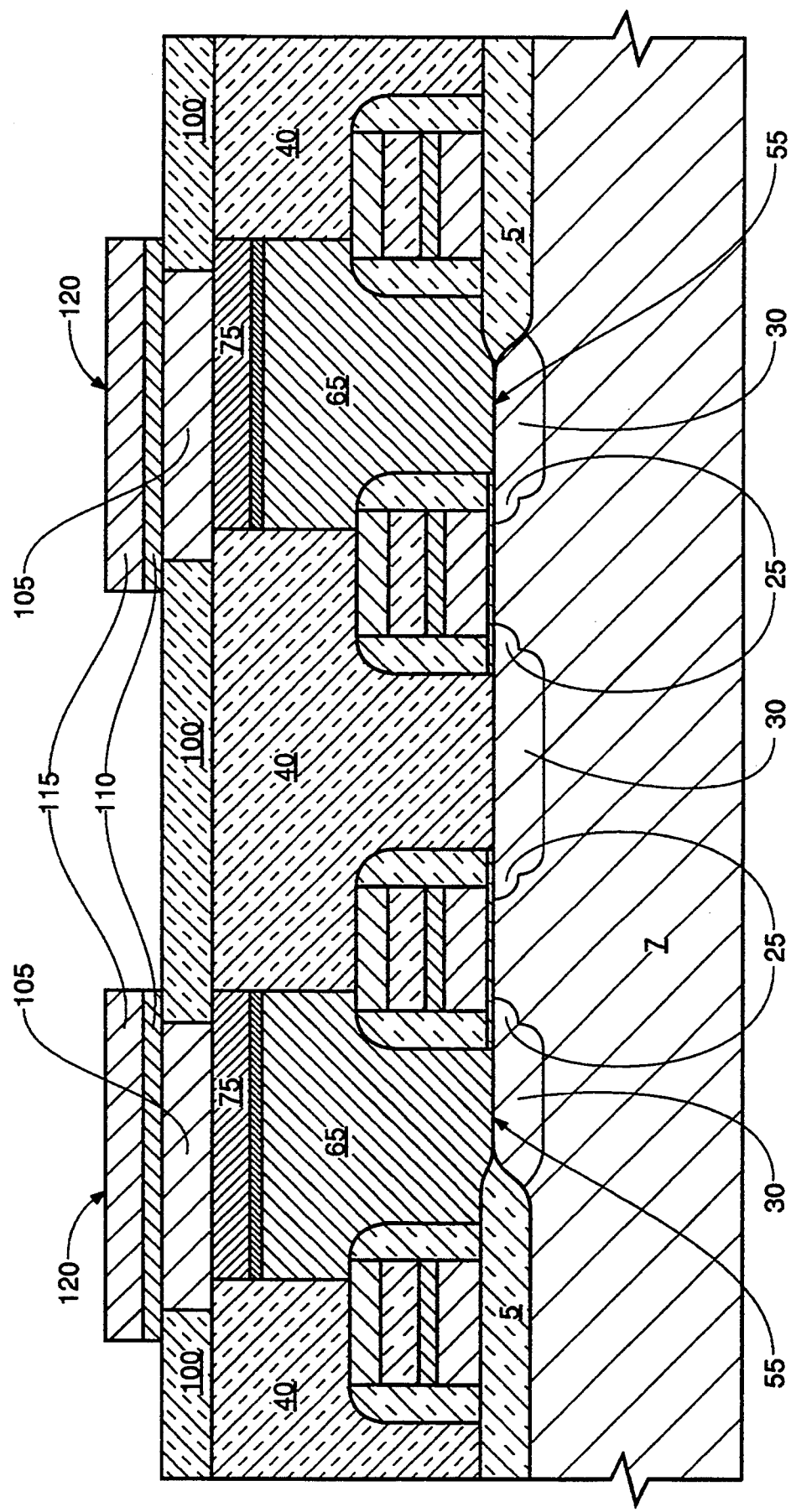

Referring to FIG. 19, the substantially planar capacitors of the invention have been formed by depositing a dielectric layer 110, having a high dielectric constant and by depositing a cell plate layer 115 to form storage node capacitors 120. In FIG. 19 the dielectric layer 110 and the cell plate layer 115 have been patterned and etched to form the storage node capacitors 120.

The cell plate layer is formed with the sputter or CVD of a 50 to 200 nm thick cell plate layer 95. The cell plate layer 95 is typically Platinum, TiN or some other conductive material.

Among the suitable materials for a dielectric layer having a high dielectric constant are $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. In the applicant's invention BST is the preferred material and is deposited at a thickness range of 30 nm–300 nm by RF-magnetron sputtering or deposited by chemical vapor deposition (CVD) in a vapor environment within a temperature range of 200 to 800 degrees Celsius. The actual vapor environment and temperature may vary for the specific dielectric being deposited. These variations are well known to those skilled in the art.

The titanium nitride layer 75 is not oxidized during the application of a high temperature anneal due to the fact that it is protected on its sidewalls by the first insulative layer and that it is protected on its upper surface by the platinum layer and the second insulative layer. Therefore even after the formation of the dielectric layer the recess retains the original titanium nitride 75 formed therein and capacitance is not sacrificed as it would be when portions of the titanium nitride 75 are consumed by oxidation. Therefore capacitance is effectively increased over methods where portions of titanium nitride are oxidized.

The process can be continued or modified to accommodate the steps described in U.S. Pat. No. 5,168,073, previously incorporated by reference, for providing electrical interconnection between a plurality of capacitors thus formed.

By utilizing the method of the preferred embodiments of the invention, a high density memory device is provided featuring a capacitor formed in a compact area as a result of a dielectric layer having a high dielectric constant. The method of the invention provides retention of storage node integrity during an anneal of the dielectric layer and allows for the deposition a very thick platinum layer as a portion of the first electrode.

Although alternate processes have been described for forming the storage cell capacitor it is apparent the processes are equally applicable for the fabrication of other types of capacitors. It should also be apparent to one skilled in the art that changes and modifications may be made to such things as deposition depths, deposit methods, removal methods and the like without departing from the spirit and scope of the invention as claimed.

What is claimed is:

1. A capacitor having a storage node electrode, comprising:
   a) a first electrically insulative region overlying a substrate;
   b) a plug region having a bottom surface, a top surface, and a sidewall surface, said bottom surface contacting said substrate, said sidewall surface adjacent to said first electrically insulative region, and said top surface recessed from a top surface of said first electrically insulative region;
   c) a diffusion barrier region overlying said plug region, said diffusion barrier region having a top surface, said top surface of said diffusion barrier region substantially planar to said top surface of said first electrically insulative region;
   d) a second electrically insulative region overlying at least a portion of said first electrically insulative region; and
   e) an protective region selected in order to prohibit oxidation of said storage node electrode, said protective region overlying and adjacent to at least a portion of said top surface of said diffusion barrier region, said diffusion barrier region minimizing a diffusion of atoms between said plug region and said protective region, said protective region having an upper sidewall surface and a lower sidewall surface, at least said lower sidewall surface adjacent to said second electrically insulative region and overlying said first electrically insulative region, at least said protective region forming the storage node electrode of the capacitor.

2. The capacitor as specified in claim 1, wherein said upper sidewall surface of said protective region is adjacent to said second electrically insulative region.

3. The capacitor as specified in claim 1, wherein at least a portion of said top surface of said protective region is substantially planar to a top surface of said second electrically insulative region.

4. The capacitor as specified in claim 1, further comprising a contact region interposed between said diffusion barrier region and said plug region, said contact region minimizing an electrical resistance between said diffusion barrier region and said plug region.

5. The capacitor as specified in claim 4, wherein said contact region is selected from a group of materials consisting of refractory metals and metal nitrides.

6. The capacitor as specified in claim 4, wherein said contact region is selected from a group of materials consisting of Ti, W, Co, Ta, and Mo.

7. The capacitor as specified in claim 4, wherein said contact region forms a silicide with polysilicon during a thermal anneal.

8. The capacitor as specified in claim 1, further comprising:
   a) a dielectric layer overlying said protective region and physically isolated from said diffusion barrier region by said second electrically insulative region and said protective region; and
   b) a conductive layer overlying said dielectric layer, said conductive layer forming a cell plate electrode of the capacitor, an integrity of the storage node electrode maintained during a fabrication of said dielectric layer and said conductive layer.

9. The capacitor as specified in claim 8, wherein said dielectric layer has a dielectric constant greater than 50.

10. The capacitor as specified in claim 8, wherein said dielectric layer is selected from a group of materials consisting of $Ba_xSr_{(1-x)}TiO_3$, $BaTiO_3$, $SrTiO_3$, $PbTiO_3$, $Pb(Zr,Ti)O_3$, $(Pb,La)(Zr,Ti)O_3$, $(Pb,La)TiO_3$, $KNO_3$, and $LiNbO_3$.

11. The capacitor as specified in claim 8, wherein said dielectric layer is substantially planar.

12. The capacitor as specified in claim 8, wherein said conductive layer is substantially planar.

13. The capacitor as specified in claim 1, wherein said diffusion barrier region prohibits diffusion of atoms.

14. The capacitor as specified in claim 1, wherein said diffusion barrier region prohibits silicon diffusion.

15. The capacitor as specified in claim 1, wherein said diffusion barrier region is fabricated with a material selected from a group of materials consisting of refractory metals, conductive metal oxides, and metal nitrides.

16. The capacitor as specified in claim 1, wherein said diffusion barrier layer is fabricated from a material selected from a group of materials consisting of Ta, TiN, TaN, Ti, $RuO_2$, Ru.

17. The capacitor as specified in claim 1, wherein said protective region is fabricated from a material selected from a group consisting of non-oxidizing materials and conductive oxides.

18. The capacitor as specified in claim 1, wherein said protective region is fabricated with a material selected from a group consisting of platinum and $RuO_2$.

19. The capacitor as specified in claim 1, wherein said plug region is a silicon.

20. A capacitor having a storage node electrode, comprising:
  a) a first electrically insulative region overlying a substrate;
  b) a plug region having a bottom surface, a top surface, and a sidewall surface, said bottom surface contacting said substrate, said sidewall surface adjacent to said first electrically insulative region, and said top surface recessed from a top surface of said first electrically insulative region;
  c) a diffusion barrier region overlying said plug region, said diffusion barrier region having a top surface, said top surface of said diffusion barrier region substantially planar to said top surface of said first electrically insulative region;
  d) a second electrically insulative region overlying at least a portion of said first electrically insulative region; and
  e) an protective region selected in order to prohibit oxidation of said storage node electrode during annealing performed during a fabrication of the capacitor, said protective region overlying and adjacent to at least a portion of said top surface of said diffusion barrier region, said diffusion barrier region minimizing a diffusion of atoms between said plug region and said protective region, said diffusion barrier region covered in its entirety by said second insulative layer and said protective region, said protective region, said diffusion barrier region and said plug region forming the storage node electrode of the capacitor.

* * * * *